(12) United States Patent
Yokoyama

(10) Patent No.: US 7,847,225 B2
(45) Date of Patent: Dec. 7, 2010

(54) OPTICAL NEURAL NETWORK

(75) Inventor: Shin Yokoyama, Higashihiroshima (JP)

(73) Assignee: Hiroshima University, Higashihiroshima-shi, Hiroshima (JP)

(*) Notice: Subject to any disclaimer, the term of this patent is extended or adjusted under 35 U.S.C. 154(b) by 0 days.

(21) Appl. No.: 12/602,072

(22) PCT Filed: May 2, 2008

(86) PCT No.: PCT/JP2008/001139

§ 371 (c)(1),
(2), (4) Date: Nov. 25, 2009

(87) PCT Pub. No.: WO2009/133592

PCT Pub. Date: Nov. 5, 2009

(65) Prior Publication Data

US 2010/0176278 A1 Jul. 15, 2010

(51) Int. Cl.
*G06F 15/18* (2006.01)
*G06E 3/00* (2006.01)
(52) U.S. Cl. .................. 250/201.1; 706/33; 382/156
(58) Field of Classification Search ............. 250/214.1, 250/216, 214 R; 257/85, E33.076; 706/15, 706/33; 382/156, 158
See application file for complete search history.

(56) References Cited

U.S. PATENT DOCUMENTS

2010/0176278 A1* 7/2010 Yokoyama ............... 250/214.1

FOREIGN PATENT DOCUMENTS

| JP | 02-051713 | 2/1990 |
|---|---|---|
| JP | 04-034524 | 2/1992 |
| JP | 06-018953 | 1/1994 |
| JP | 06-076092 | 3/1994 |
| JP | 07-005489 | 1/1995 |
| JP | 07-129533 | 5/1995 |
| JP | 08-194557 | 7/1996 |

OTHER PUBLICATIONS

International Search Report of International Application No. PCT/JP2008/001139 and English Translation of the same, mail date Jun. 17, 2008, 2 pages.

* cited by examiner

*Primary Examiner*—Kevin Pyo
(74) *Attorney, Agent, or Firm*—Foley & Lardner LLP

(57) ABSTRACT

An input layer outputs light having a relatively narrow emission angle distribution to a middle layer as an output signal if the signal level of input signal is relatively high and outputs light having a relatively broad emission angle distribution to the middle layer as the output signal if the signal level of input signal is relatively low. The middle layer outputs light having a relatively narrow emission angle distribution as an output signal to an output layer if the signal level of the output signal from input layer is relatively high and outputs light having a relatively broad emission angle distribution to the output layer as an output signal if the signal level of the output signal from the input layer is relatively low.

14 Claims, 16 Drawing Sheets

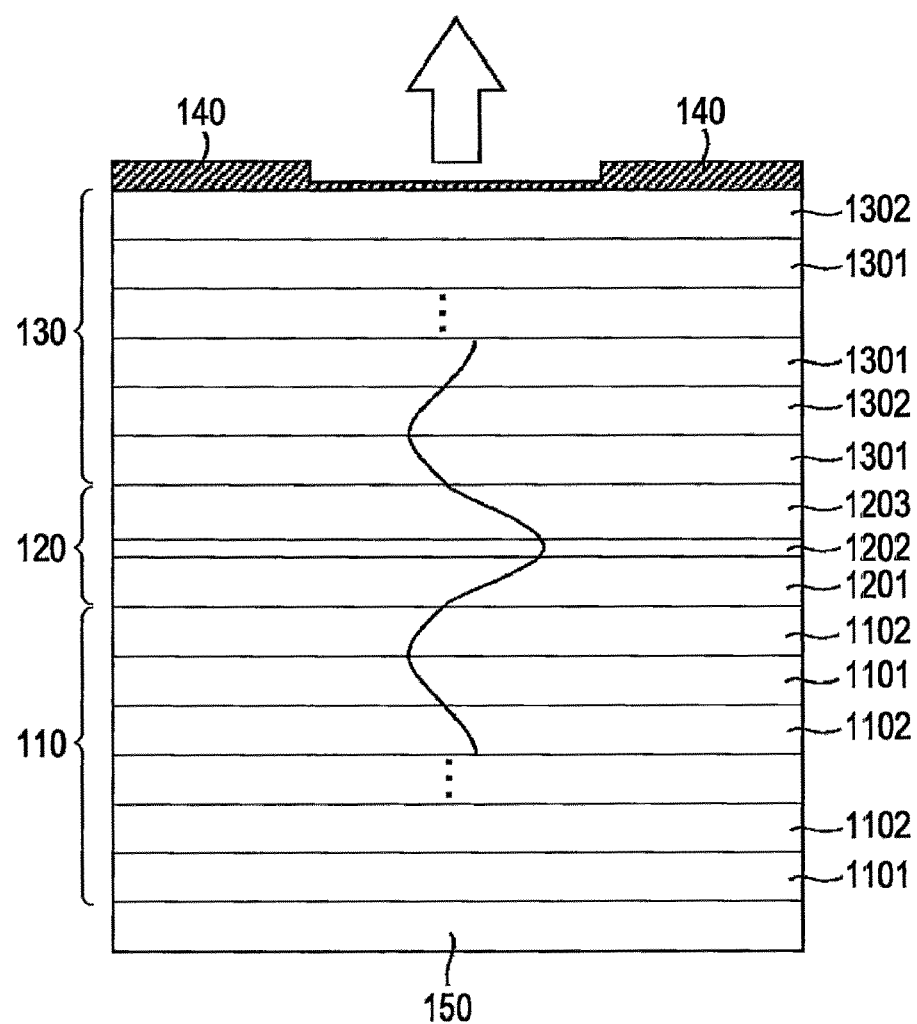
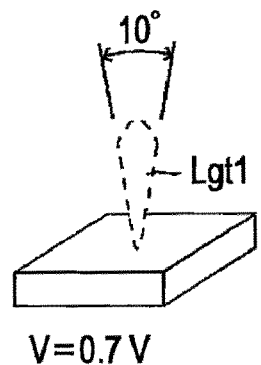

FIG. 11
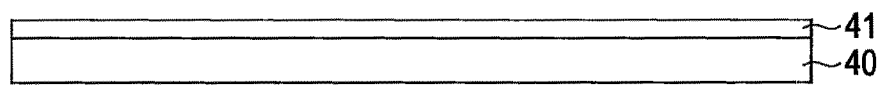
(h)
(i)
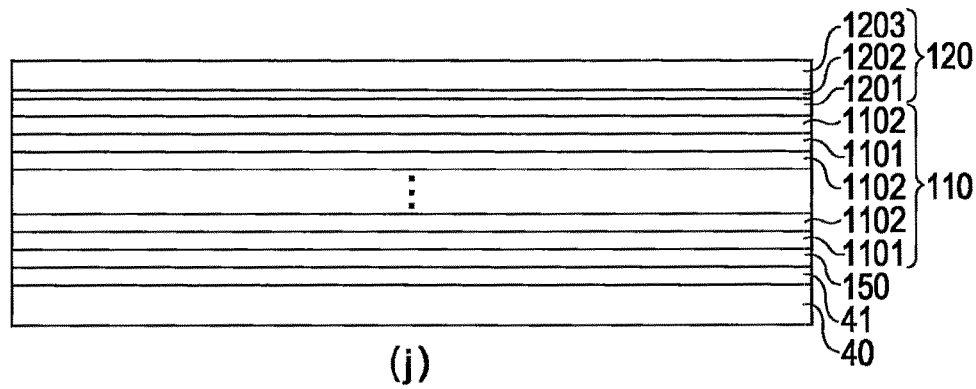
(j)
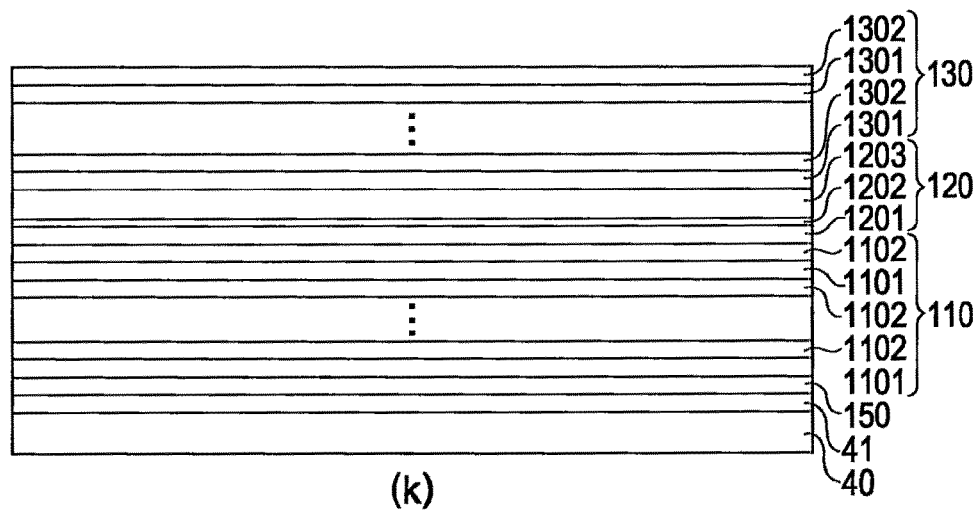
(k)

FIG. 12
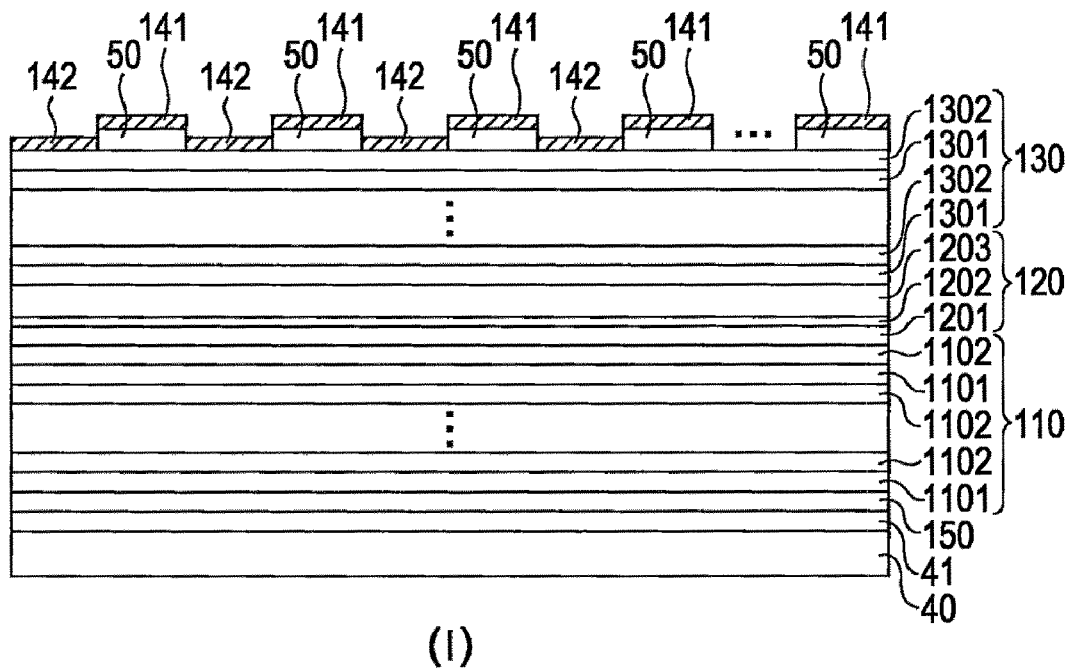
(l)
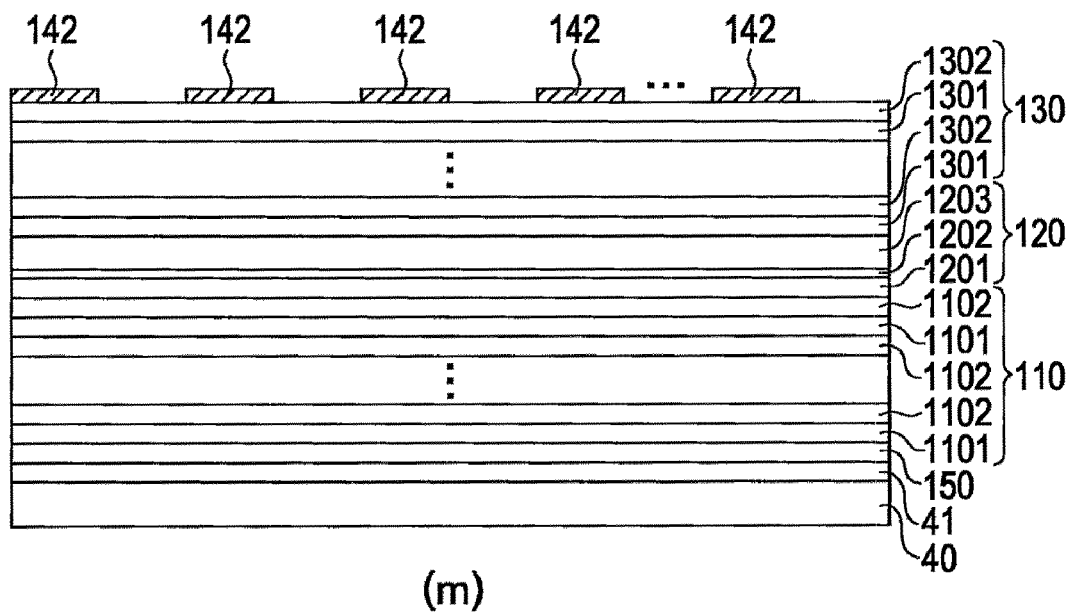
(m)

FIG. 13
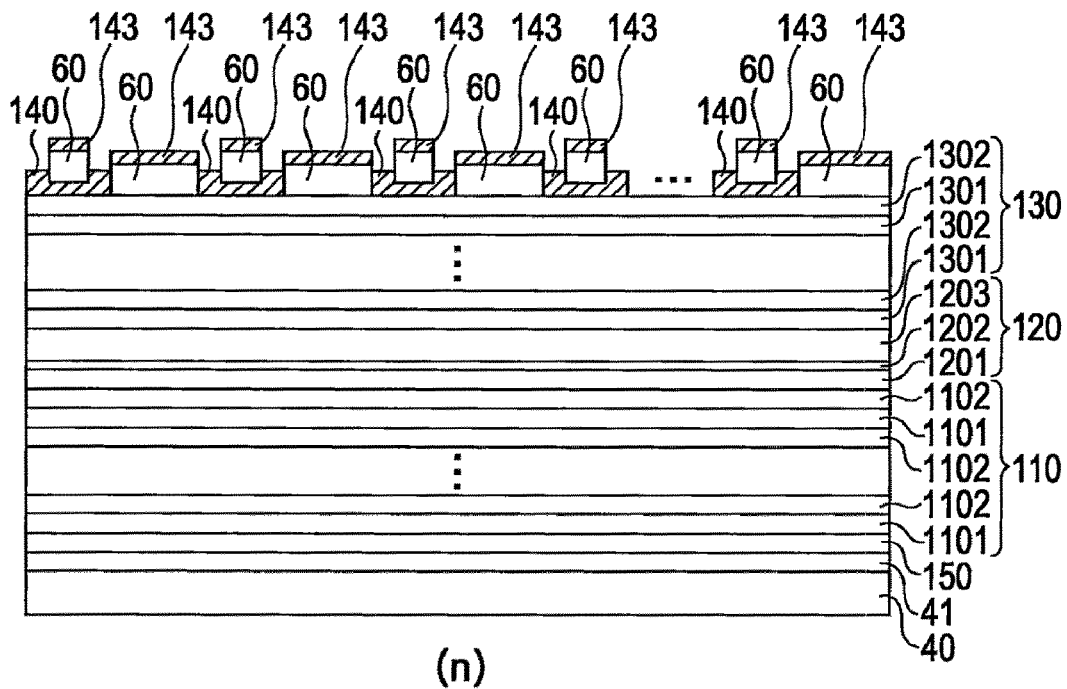
(n)
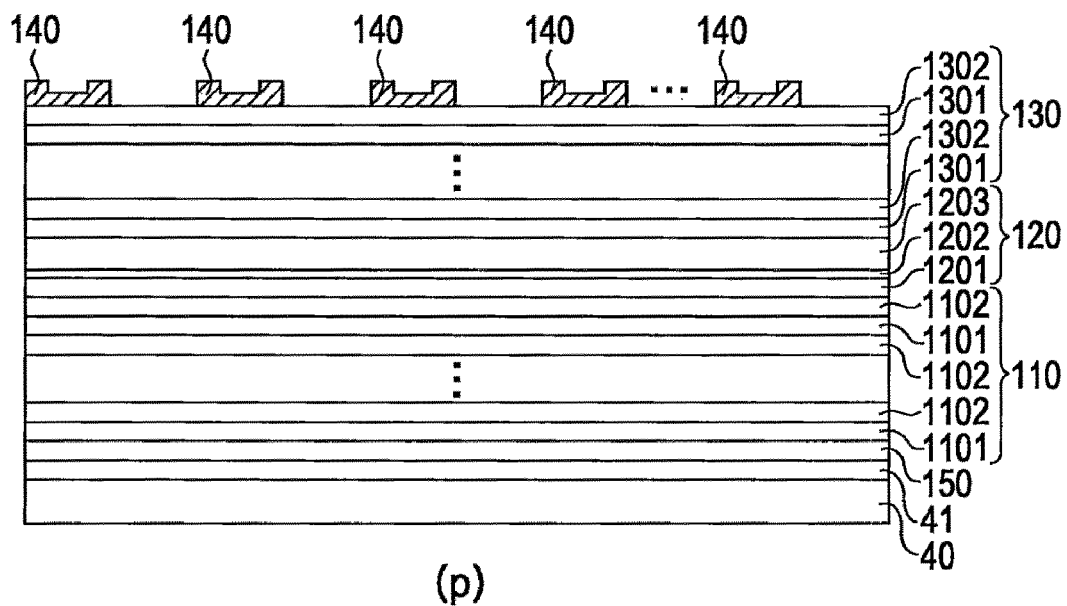
(p)

FIG. 14
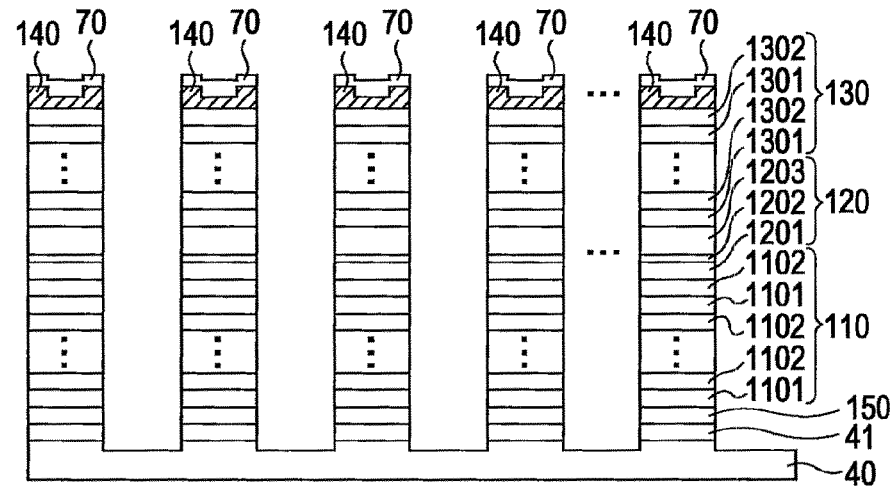
(q)
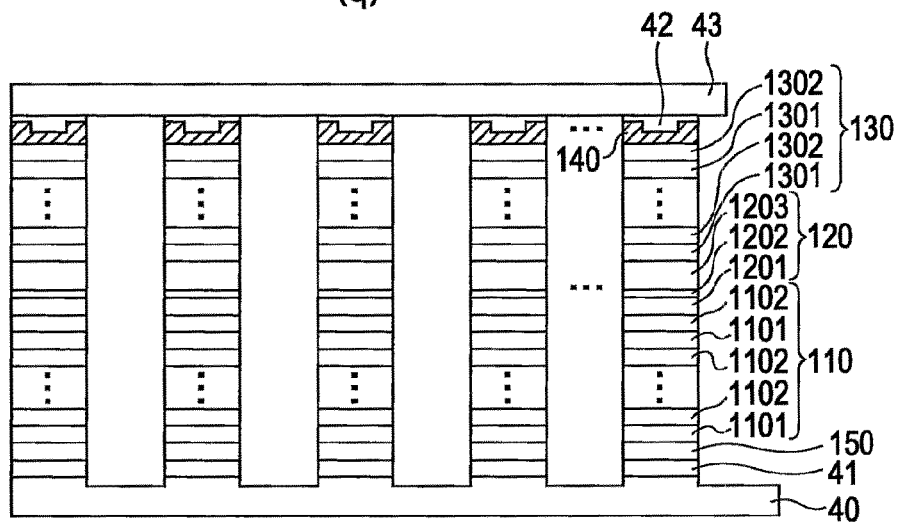
(r)
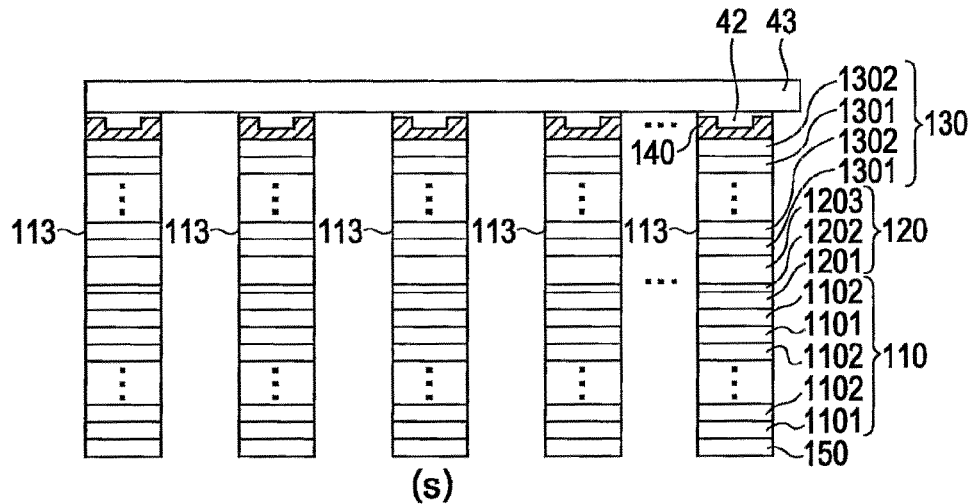
(s)

OPTICAL NEURAL NETWORK

CROSS-REFERENCE TO RELATED PATENT APPLICATIONS

The present application claims priority as a national stage application of the International Application No. PCT/JP2008/001139 filed on May 2, 2008, the entire contents of which are incorporate herein by reference in their entireties.

Technical Field

The present invention relates to an optical neural network.

Background Art

Hitherto, a neural network that performs input/output by electromagnetic waves such as light has been known (Japanese Unexamined Patent Application Publication No. 7-129533). The neural network includes an input layer, a middle layer and an output layer. Each layer of the input layer, the middle layer and the output layer includes a plurality of neurons. Each of the plurality of neurons is composed of a light receiving unit and a light emitting unit.

An input signal is input to the input layer by using a plurality of wavelength bands. In each neuron in the input layer, the light receiving unit identifies the frequency of the input signal. The light receiving unit holds a correspondence table between frequencies and connection weights and extracts connection weight corresponding to the identified frequency with reference to the correspondence table.

Then, the light receiving unit multiplies the input signal by the extracted connection weight and outputs it to the light emitting unit. The light receiving unit performs the operations for each of the wavelength bands.

Then, the light emitting unit obtains the total sum of a plurality of signals input from the light receiving unit and outputs the obtained total sum using its own wavelength band.

In this way, in the conventional neural network, the connection weight used in each layer is determined with reference to a predetermined correspondence table.

DISCLOSURE OF INVENTION

However, in the conventional neural network, the connection weight is determined fixedly if the frequency of input signal is determined. Therefore, there is a problem that it is difficult to change the connection weight flexibly.

Accordingly, the present invention was made in order to solve the problem, and it is an object of the present invention to provide an optical neural network that allows the flexible change of the connection weight.

According to the present invention, an optical neural network includes an input semiconductor layer, a middle semiconductor layer and an output semiconductor layer. The input semiconductor layer receives an input signal and outputs a first output signal on the basis of the received input signal. The middle semiconductor layer is provided to face the input semiconductor layer and receives the first output signal from the input semiconductor layer and outputs a second output signal on the basis of the received first output signal. The output semiconductor layer is provided to face the middle semiconductor layer and receives the second output signal from the middle semiconductor layer and outputs a final output signal on the basis of the received second output signal. The input semiconductor layer outputs light having a first emission angle distribution to the middle semiconductor layer as the first output signal if the signal level of the input signal is a first level and outputs light having a second emission angle distribution which is broader than the first emission angle distribution to the middle semiconductor layer as the first output signal if the signal level of the input signal is a second level which is lower than the first level. The middle semiconductor layer outputs a light having a third emission angle distribution to the output semiconductor layer as the second output signal if the signal level of the first output signal is a third level and outputs light having a fourth emission angle distribution which is broader than the third emission angle distribution to the output semiconductor layer as the second output signal if the signal level of the first output signal is a fourth level which is lower than the third level.

The input semiconductor layer may include i (where i is a positive integer) input units. The middle semiconductor layer includes j (where j is a positive integer) middle units. The output semiconductor layer includes k (where k is a positive integer) output units. Each of the i input units includes a first semiconductor substrate, a detector, and a first semiconductor light emitting device. The detector is provided on one principal surface of the first semiconductor substrate and detects the signal level of the input signal and outputs output voltage reflecting the detected signal level. The first semiconductor light emitting device is provided on the opposite surface to the one principal surface of the first semiconductor substrate where the detector is provided, emits light having a relatively narrow emission angle distribution to the middle semiconductor layer when the voltage level of the input voltage from the detector is relatively high, and emits light having a relatively broad emission angle distribution to the middle semiconductor layer when the voltage level of the input voltage from the detector is relatively low. Each of the j middle units includes a second semiconductor substrate, a first photodetector and a second semiconductor light emitting device. The second semiconductor substrate is provided to face the first semiconductor substrate. The first photodetector is provided on one principal surface on the first semiconductor substrate side of the second semiconductor substrate and receives light emitted from the input unit included in the input semiconductor layer and outputs voltage reflecting the intensity of the received light. The second semiconductor light emitting device is provided on the opposite surface to the one principal surface of the second semiconductor substrate where the first photodetector is provided, emits light having a relatively narrow emission angle distribution to the output semiconductor layer when the voltage level of voltage output from the first photodetector is relatively high, and emits light having a relatively broad emission angle distribution to the output semiconductor layer when the voltage level of voltage output from the first photodetector is relatively low. Each of the k output units includes a third semiconductor substrate, a second photodetector and an output circuit. The third semiconductor substrate is provided to face the second semiconductor substrate. The second photodetector is provided on one principal surface on the second semiconductor substrate side of the third semiconductor substrate and receives light emitted from the middle unit included in the middle semiconductor layer and outputs the voltage reflecting the intensity of the received light. The output circuit converts the voltage output from the second photodetector to an element signal constituting the final output signal and outputs the converted element signal.

Each of the i input units may further include a first drive circuit. The first drive circuit is provided on the opposite surface to the one principal surface of the first semiconductor substrate where the detector is provided and converts the input voltage output from the detector to first driving voltage in accordance with the voltage level and outputs the converted first driving voltage to the first semiconductor light emitting device. Each of the j middle units further includes a second drive circuit. The second drive circuit is provided on the opposite surface to the one principal surface of the second semiconductor substrate where the first photodetector is provided and converts the voltage output from the first photodetector to second driving voltage in accordance with the voltage level and outputs the converted second driving voltage to the second semiconductor light emitting device. The first semiconductor light emitting device emits light having the emission angle distribution in accordance with the voltage level of the first driving voltage to the middle semiconductor layer. The second semiconductor light emitting device emits light having the emission angle distribution in accordance with the voltage level of the second driving voltage to the output semiconductor layer.

Each of the i input units may further include a first metal wire. The first metal wire penetrates the first semiconductor substrate in the thickness direction and connects the detector to the first drive circuit. Each of the j middle units further includes a second metal wire. The second metal wire penetrates the second semiconductor substrate in the thickness direction and connects the first photodetector to the second drive circuit.

The input signal is composed of an optical signal, and the detector may receive the optical signal, convert the received optical signal to the input voltage reflecting the strength of the optical signal and output it to the first drive circuit.

The first semiconductor light emitting device is fixed to the first semiconductor substrate by pasting, and the second semiconductor light emitting device may be fixed to the second semiconductor substrate by pasting.

The first semiconductor light emitting device is formed on the first semiconductor substrate by heteroepitaxy, and the second semiconductor light emitting device may be formed on the second semiconductor substrate by heteroepitaxy.

The first semiconductor light emitting device contains a different material from the material of the first semiconductor substrate, and the second semiconductor light emitting device may contain a different material from the material of the second semiconductor substrate.

The output circuit converts voltage output from the second photodetector to a digital value and may output the converted digital value as the element signal.

The output circuit may include a third semiconductor light emitting device. The third semiconductor light emitting device is provided on the opposite surface to the one principal surface of the third semiconductor substrate where the second photodetector is provided, emits light having a relatively narrow emission angle distribution as the element signal when the voltage level of the voltage output from the second photodetector is relatively high, and emits light having a relatively broad emission angle distribution as the element signal when the voltage level of the voltage output from the second photodetector is relatively low.

The output circuit may further include a drive circuit. The drive circuit generates a relatively low third drive voltage when the voltage level of voltage output from the second photodetector is relatively high and generates a relatively high third drive voltage when the voltage level of voltage output from the second photodetector is relatively low, and outputs the generated third driving voltage to the third semiconductor light emitting device. The third semiconductor light emitting device outputs light having the emission angle distribution in accordance with the voltage level of the third driving voltage as the element signal.

The third semiconductor light emitting device may be fixed to the third semiconductor substrate by pasting.

The third semiconductor light emitting device is formed on the third semiconductor substrate by heteroepitaxy.

In the optical neural network according to the present invention, the input semiconductor layer transmits the input signal to the middle semiconductor layer by using light having the emission angle distribution determined in accordance with the signal level of input signal, the middle semiconductor layer transmits the second output signal to the output semiconductor layer by using light having the emission angle distribution determined in accordance with the signal level of the first output signal output from the input semiconductor layer. In other words, the input semiconductor layer connects with the middle semiconductor layer by using the emission angle distribution determined in accordance with the signal level of input signal as a connection weight, and middle semiconductor layer connects with the output semiconductor layer by using the emission angle distribution depending on the signal level of the first output signal as a connection weight. As a result, the input semiconductor layer changes the connection weight in accordance with the signal level of input signal to connect with the middle semiconductor layer, and the middle semiconductor layer changes the connection weight in accordance with the signal level of the first output signal to connect with the output semiconductor layer.

Therefore, according to the present invention, the connection weights can be changed flexibly in accordance with the signal levels.

BRIEF DESCRIPTION OF DRAWINGS

FIG. 6 is a sectional view of a semiconductor light emitting device shown in FIG. 5.

FIG. 7 is a conceptual diagram of emitted light from a semiconductor light emitting device shown in FIG. 6.

FIG. 11 is a second process chart of the manufacturing method for the optical neural network shown in FIG. 1.

FIG. 12 is a third process chart of the manufacturing method for the optical neural network shown in FIG. 1.

FIG. 13 is a fourth process chart of the manufacturing method for the optical neural network shown in FIG. 1.

FIG. 14 is a fifth process chart of the manufacturing method for the optical neural network shown in FIG. 1.

BEST MODES FOR CARRYING OUT THE INVENTION

Figure 1:
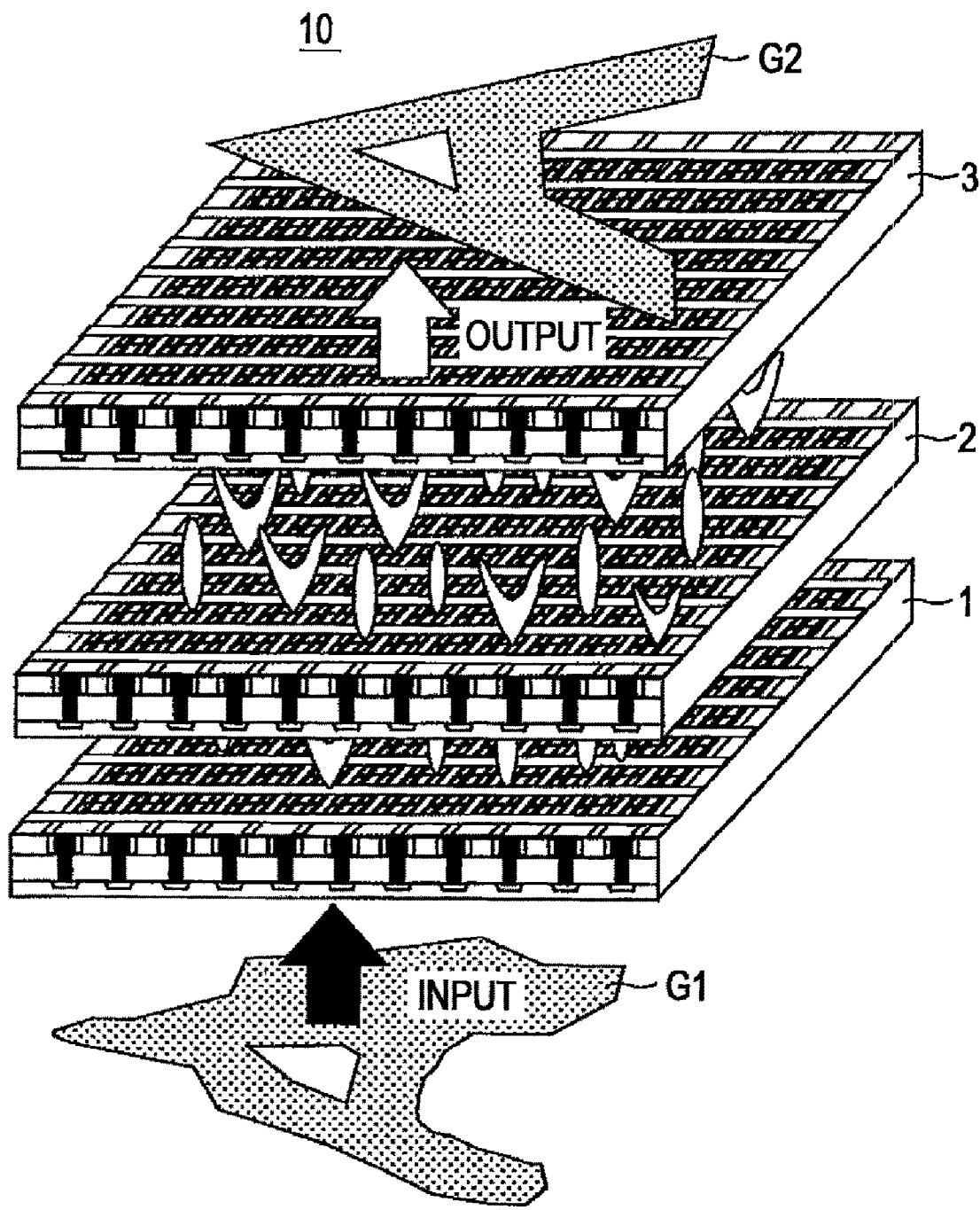
FIG. 1 is a configuration diagram of an optical neural network according to embodiment of the present invention.

With reference to drawings, embodiments of the present invention will be described in detail. In the drawings, the same or similar components are denoted by the same reference numerals, and a detailed description thereof will be not repeated.

FIG. 1 is a configuration diagram of an optical neural network according to embodiment of the present invention. Referring to FIG. 1, an optical neural network 10 according to embodiment of the present invention includes an input layer 1, a middle layer 2 and an output layer 3.

Each of the input layer 1, the middle layer 2 and the output layer 3 is composed of a semiconductor layer. The middle layer 2 is placed to face the input layer 1, the output layer 3 is placed to face the middle layer 2.

The input layer 1 receives an input signal composed of an optical signal and outputs light having an emission angle distribution according to the signal level of the received input signal as an output signal to the middle layer 2.

The middle layer 2 receives the output signal output from the input layer 1 and outputs the light having the emission angle distribution according to the signal level of the received output signal as an output signal to the output layer 3.

The output layer 3 receives the output signal output from the middle layer 2 and outputs the light having the emission angle distribution according to the signal level of the received output signal as a final output signal to the outside.

Then, the optical neural network 10 may receive, for example, image data G1 of a distorted letter "A" as an input signal, processes the received image data and outputs image data G2 of the sharp letter "A" with no distortion.

Figure 2:
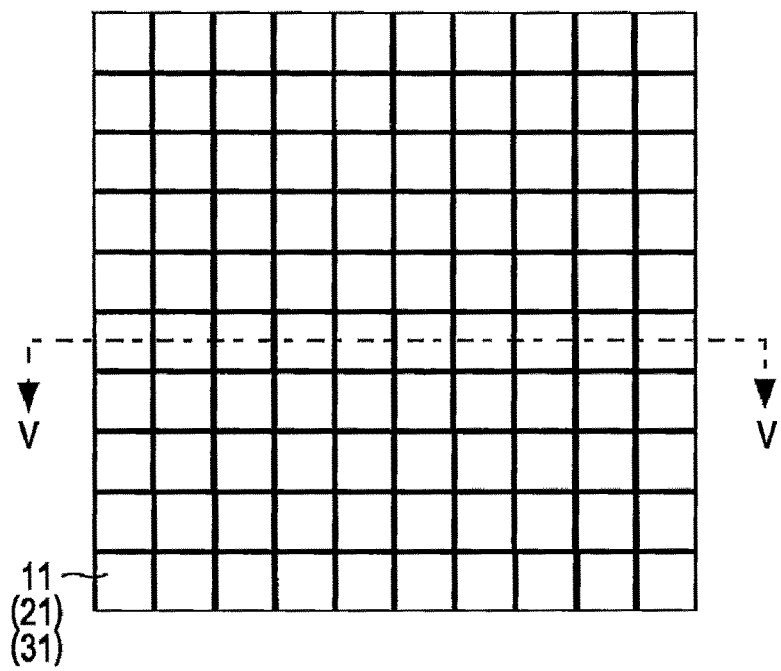
FIG. 2 is a plan view of an input layer viewed from a middle layer side shown in FIG. 1.

FIG. 2 is a plan view of the input layer 1 viewed from the middle layer 2 side shown in FIG. 1. Referring to FIG. 2, the input layer 1 may, for example, includes 100 input units 11. Then, the 100 input units 11 are arranged in a grid of 10×10.

Figure 3:
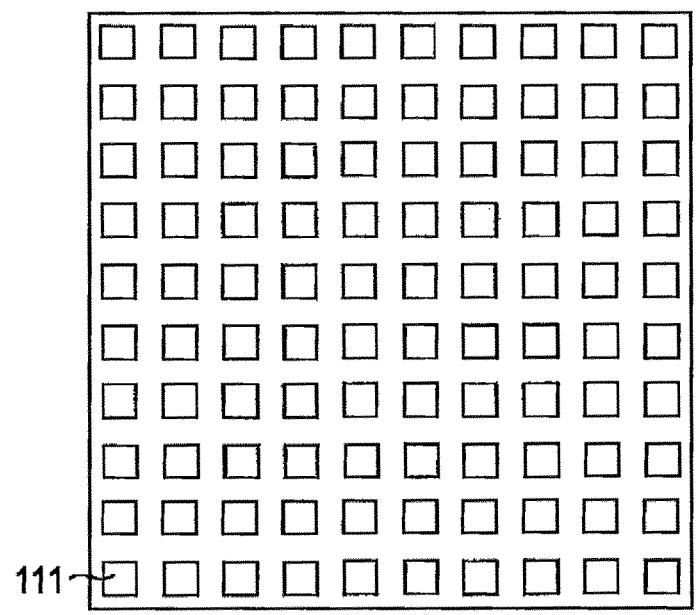
FIG. 3 is a plan view of the rear surface of the input layer shown in FIG. 2.

FIG. 3 is a plan view of the rear surface of the input layer 1 shown in FIG. 2. Referring to FIG. 3, each of the input units 11 includes a photodetector unit 111. Therefore, on the rear surface of the input layer 1, the 100 photodetector units 111 are arranged in the grid.

Notably, the plan view of the middle layer 2 viewed from the output layer 3 side shown in FIG. 1 is the same as the plan view of the input layer 1 shown in FIG. 2, and the middle layer 2 includes 100 middle units 21 arranged in the grid of 10×10. The plan view of the output layer 3 viewed from the output side shown in FIG. 1 is the same as the plan view of the input layer 1 shown in FIG. 2, and the output layer 3 includes 100 output units 31 arranged in the grid of 10×10.

Furthermore, the plan view of the middle layer 2 viewed from the input layer 1 side shown in FIG. 1 is the same as the plan view of the input layer 1 shown in FIG. 3, and the middle layer 2 includes 100 photodetector units arranged in the grid of 10×10. Furthermore, the plan view of the output layer 3 viewed from the middle layer 2 side shown in FIG. 1 is the same as the plan view of the input layer 1 shown in FIG. 3, and the output layer 3 includes 100 photodetector units arranged in the grid of 10×10.

Figure 4:
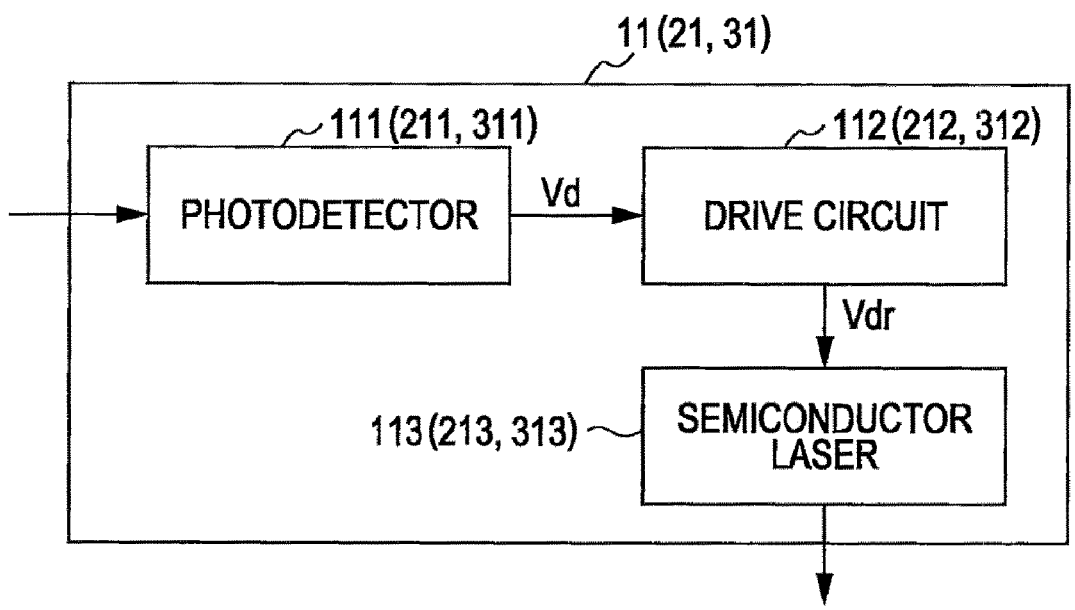
FIG. 4 is a configuration diagram of an input unit shown in FIG. 2.

FIG. 4 is a configuration diagram of the input unit 11 shown in FIG. 2. Referring to FIG. 4, the input unit 11 includes the photodetector unit 111, a drive circuit 112 and a semiconductor light emitting device 113.

The photodetector unit 111 receives an optical signal as an input signal and detects an optical signal equal to or higher than a threshold value in the received optical signal. Then, the photodetector unit 111 converts the detected optical signal to voltage Vd having the voltage level according to the strength of the optical signal and outputs the converted voltage Vd to the drive circuit 112.

The drive circuit 112 receives the voltage Vd from the photodetector unit 111, determines the driving voltage Vdr according to the voltage level of the received voltage Vd by a method, which will be described later, and outputs the determined driving voltage Vdr to the semiconductor light emitting device 113.

The semiconductor light emitting device 113 receives the driving voltage Vdr from the drive circuit 112, oscillates the light having the emission angle distribution according to the voltage level of the received driving voltage Vdr and emits the oscillated light.

The middle unit 21 in the middle layer 2 and the output unit 31 in the output layer 3 has the same configuration as that of the input unit 11 shown in FIG. 4.

In this case, a photodetector 211 in the middle unit 21 receives light emitted from the input layer 1, detects light equal to or higher than a threshold value of the received light, converts the detected light to voltage Vd, and outputs it to a drive circuit 212. Then, the drive circuit 212 in the middle unit 21 determines the driving voltage Vdr according to the voltage level of the voltage Vd received from the photodetector 211 by a method, which will be described later, and outputs the determined driving voltage Vdr to a semiconductor light emitting device 213. The semiconductor light emitting device 213 in the middle unit 21 oscillates the light having the emission angle distribution according to the voltage level of the driving voltage Vdr received from the drive circuit 212 and emits the oscillated light.

A photodetector 311 in the output unit 31 receives light emitted from the middle layer 2, detects light equal to or higher than a threshold value of the received light, converts the detected light to voltage Vd, and outputs it to a drive circuit 312. Then, the drive circuit 312 in the output unit 31 determines the driving voltage Vdr according to the voltage level of the voltage Vd received from the photodetector 311 by a method, which will be described later, and outputs the determined driving voltage Vdr to a semiconductor light emitting device 313. The semiconductor light emitting device 313 in the output unit 31 oscillates the light having the emission angle distribution according to the voltage level of the driving voltage Vdr received from the drive circuit 312 and emits the oscillated light.

Figure 5:
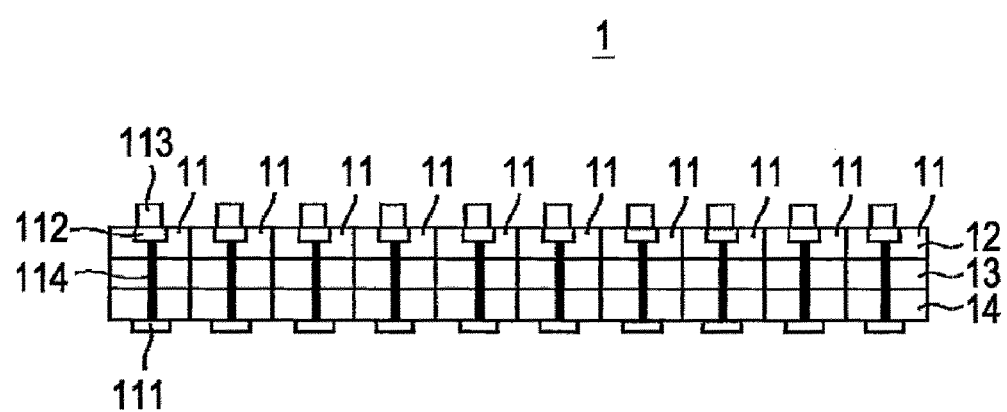
FIG. 5 is a sectional view of the input layer, which is taken at the line V-V shown in FIG. 2.

FIG. 5 is a sectional view of the input layer 1, which is taken at the line V-V shown in FIG. 2. Referring to FIG. 5, the input layer 1 includes semiconductor layers 12 and 14 and an insulating film 13. Each of the semiconductor layers 12 and 14 may contain silicon (Si) and the insulating film 13 may contain silicon oxide film ($SiO_2$), for example. Each of the semiconductor layers 12 and 14 is 20 μm thick, and the insulating film 13 is 1 to 2 μm thick.

The insulating film 13 is provided on one principal surface of the semiconductor layer 12. The semiconductor layer 14 is adhered to the insulating film 13 by pasting them together. Therefore, the semiconductor layers 12 and 14 and the insulating film 13 include an SOI (Silicon On Insulator) substrate.

Each of the input units 11 in the input layer 1 further includes a through-wire 114. In each of the input units 11 in the input layer 1, a photodetector 111 is provided on one principal surface (the surface on the opposite side of the insulating film 13 side) of the semiconductor layer 14, the drive circuit 112 and the semiconductor light emitting device 113 is provided on one principal surface (the surface on the opposite side of the insulating film 13) of semiconductor layer 12. The through-wire 114 penetrates the semiconductor layer 12, the insulating film 13 and the semiconductor layer 14 and connects the photodetector 111 to the drive circuit 112.

Though FIG. 5 shows that the semiconductor light emitting device 113 is placed on the drive circuit 112, it is, in reality, provided in one principal surface of semiconductor layer 12, which is not on the drive circuit 112.

The cross-sectional structures of the middle layer 2 and the output layer 3 are the same as the cross-sectional structure of the input layer 1 shown in FIG. 5.

FIG. 6 is a sectional view of the semiconductor light emitting device 113 shown in FIG. 5. Referring to FIG. 6, the semiconductor light emitting device 113 includes an n-type distributed reflection film 110, an active layer 120, a p-type distributed reflection film 130, a window electrode 140 and a buffer layer 150.

The active layer 120 is provided on the n-type distributed reflection film 110 in contact with the n-type distributed reflection film 110. The p-type distributed reflection film 130 is provided on the active layer 120 in contact with the active layer 120. The window electrode 140 is provided on the p-type distributed reflection film 130 in contact with the p-type distributed reflection film 130. The buffer layer 150 is an $n^+$-type gallium arsenide ($n^+$-type GaAs) layer being a ground for forming the high quality n-type distributed reflection film 110.

The n-type distributed reflection film 110 has a structure in which an n-type aluminum gallium arsenide (AlGaAs) layer 1101 and an n-type aluminum arsenide (AlAs) layer 1102 are laminated alternately by 10 cycles. The n-type AlGaAs layer 1101 is 58.0 nm thick, and the n-type AlAs layer 1102 is 67.1 nm thick.

The active layer 120 is composed of barrier layers 1201 and 1203 and a well layer 1202. The barrier layer 1201 contains i-type AlAs and is 67.1 nm thick. The well layer 1202 contains i-type gallium arsenide (GaAs) and is 10 nm thick. The barrier layer 1203 contains i-type AlAs and is 67.1 nm thick.

As described above, the active layer 120 is composed of a single quantum well structure. The active layer 120 has a thickness of λ/2 where the oscillation wavelength of the semiconductor light emitting device 113 is λ.

The p-type distributed reflection film 130 has a structure in which a p-type AlGaAs layer 1301 and a p-type AlAs layer 1302 are laminated alternately by 10 cycles. The p-type AlGaAs layer 1301 is 58.0 nm thick, and the p-type AlAs layer 1302 is 67.1 nm thick.

The window electrode 140 has a double layer structure of Au/Cr and is approximately 10 nm thick, which allows light to pass through. The buffer layer 150 contains $n^+$-type GaAs and is approximately 2 μm thick.

The semiconductor light emitting device 213 included in the middle layer 2 and the semiconductor light emitting device 313 included in the output layer 3 have the same configuration as the semiconductor light emitting device 113 shown in FIG. 6.

Figure 8:
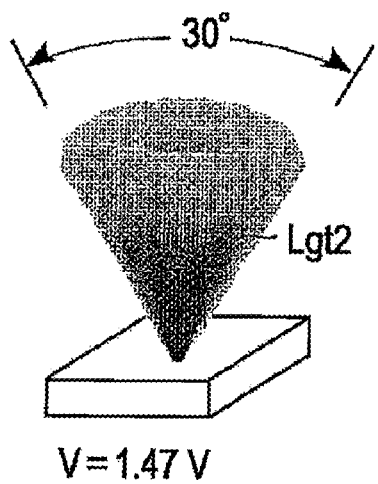
FIG. 8 is a conceptual diagram of other emitted light from the semiconductor light emitting device shown in FIG. 6.

FIG. 7 is a conceptual diagram of emitted light from the semiconductor light emitting device 113 shown in FIG. 6. FIG. 8 is a conceptual diagram of other emitted light from the semiconductor light emitting device 113 shown in FIG. 6.

The semiconductor light emitting device 113 emits emission light Lgt1 if the driving voltage Vdr is 0.7 V and emits emission light Lgt2 if the driving voltage Vdr is 1.47 V. The emission light Lgt1 has an emission angle distribution of approximately 10°, and the emission light Lgt2 has an emission angle distribution of approximately 30° and has a peak in a direction of ±15°.

Because the semiconductor light emitting device 113 has the structure in which the active layer 120 is sandwiched by the n-type distributed reflection film 110 and the p-type distributed reflection film 130, as described above, the driving voltage Vdr applied to between an emitter 140 and a gate 150 is applied to a quantum well layer in the active layer 120. Then, because the well layer 1202 in the active layer 120 is as thin as 10 nm, the electric field strength equal to or larger than $10^5$ V/cm is applied to the well layer 1202.

As a result, because the effective index of refraction of the well layer 1202 varies in accordance with the electric field strength and the direction of propagation of oscillated light varies in accordance with the electric field strength, the emission light Lgt1 or Lgt2 having different emission angle distributions is emitted in accordance with the voltage level of driving voltage Vdr.

Figure 9:
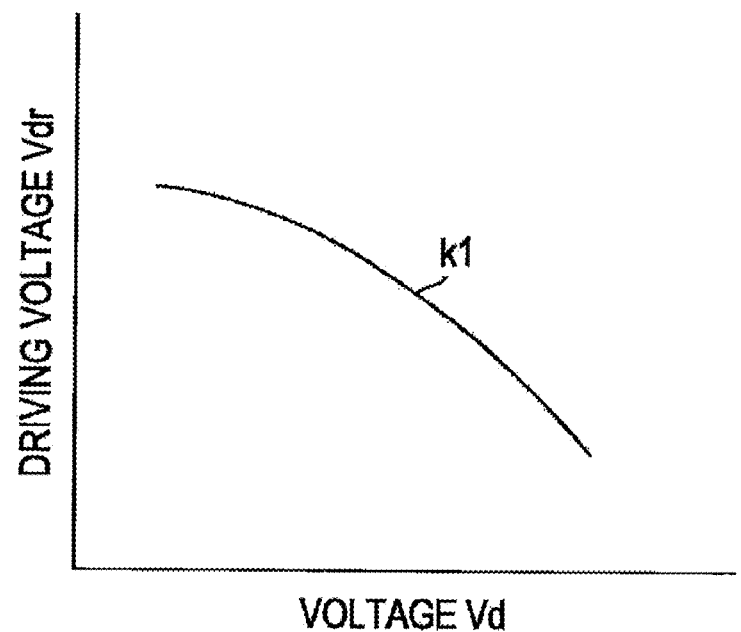
FIG. 9 is a relational diagram between voltage Vd and driving voltage Vdr.

FIG. 9 is a relational diagram between the voltage Vd and the driving voltage Vdr. In FIG. 9, the vertical axis indicates the driving voltage Vdr, and the horizontal axis indicates the voltage Vd. A curve k1 indicates a relationship between the voltage Vd and the driving voltage Vdr.

Referring to FIG. 9, the driving voltage Vdr varies non-linearly against the voltage Vd. More specifically, the driving voltage Vdr is relatively high if the voltage Vd is relatively low and is relatively low if the voltage Vd is relatively high.

The drive circuit 112 holds the relationship between the voltage Vd and the driving voltage Vdr indicated by the curve k1. If the drive circuit 112 receives the voltage Vd from the photodetector 111, the drive circuit 112 detects the driving voltage Vdr corresponding to the voltage Vd with reference to the curve k1 and outputs the detected driving voltage Vdr to the semiconductor light emitting device 113.

Therefore, if the drive circuit 112 receives relatively low voltage Vd from the photodetector 111, the drive circuit 112 outputs relatively high driving voltage Vdr to the semiconductor light emitting device 113. If the drive circuit 112 receives relatively high voltage Vd from the photodetector 111, the drive circuit 112 outputs relatively low driving voltage Vdr to the semiconductor light emitting device 113.

As a result, if the voltage Vd output from the photodetector 111 is relatively low, the semiconductor light emitting device 113 emits emission light having a relatively large emission angle distribution. If the voltage Vd output from the photodetector 111 is relatively high, the semiconductor light emitting device 113 emits emission light having a relatively small emission angle distribution.

FIGS. 10 to 15 are first to sixth process charts showing a manufacturing method for the optical neural network 10 shown in FIG. 1. The process charts shown in FIGS. 10 to FIG. 15 are process chart showing a manufacturing method for the input layer 1 in the optical neural network shown in FIG. 1.

Figure 10:
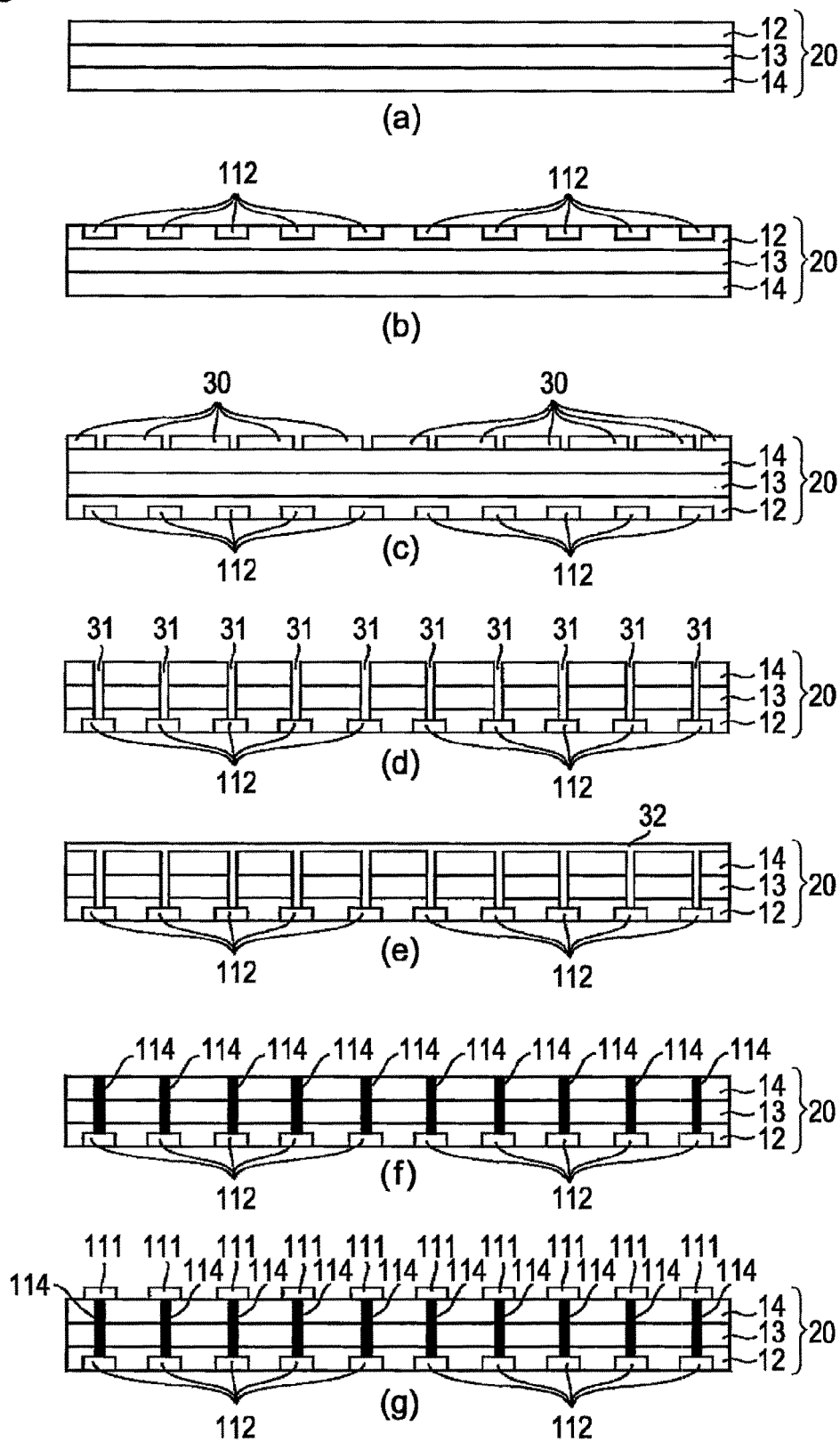
FIG. 10 is a first process chart of a manufacturing method for the optical neural network shown in FIG. 1.
Figure 15:
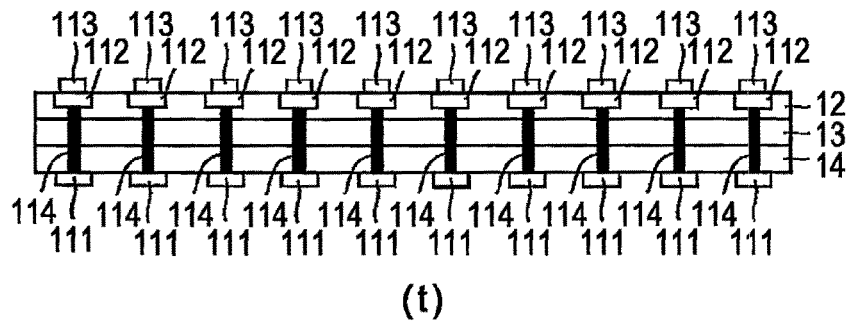
FIG. 15 is a sixth process chart of the manufacturing method for the optical neural network shown in FIG. 1.

Referring to FIG. 10, if the manufacturing of the input layer 1 is started, an SOI substrate 20 including the semiconductor layers 12 and 14 and the insulating film 13 is prepared (refer to step (a)). The drive circuit 112 in the 100 input units 11 of the input layer 1 is formed on the surface of the semiconductor layer 12 in the SOI substrate 20 by using a photolithography technology (refer to step (b)).

After that, a resist is coated over the surface of the semiconductor layer 14 in the SOI substrate 20, and the coated resist is patterned by using the photolithography technology. As a result, a resist pattern 30 is formed on the surface of the semiconductor layer 14 (refer to step (c)).

Then, by using the resist pattern 30 as a mask, a part of the semiconductor layer 14, the insulating film 13 and the semiconductor layer 12 is etched by reactive ion etching up to the drive circuit 112 to fabricate through holes 31 (refer to step (d)).

After that, an Al film 32 is formed on the through holes 31 and the surface of the semiconductor layer 14 by sputtering (refer to step (e)). Then, the Al film formed on the surface of the semiconductor layer 14 is etched to form the through-wires 114 (refer to step (f)).

Successively, an n-type Si layer and a p-type Si layer are laminated on the surface of the semiconductor layer 14 sequentially, and by using the photolithography technology, the n-type Si layer and p-type Si layer formed on the surface of the semiconductor layer 14 is etched such that the n-type Si/p-type Si connecting to the through-wires 114 can remain. Thus, the photodetector 111 included in each of the input units 11 of the input layer 1 is formed on the surface of the semiconductor layer 14 (refer to step (g)).

After that, Molecular Beam Epitaxy (MBE) is used to deposit an $n^+$-type AlAs layer 41 on the surface of an n-type GaAs substrate 40 (refer to step (h)). In this case, Al, As and Si metal, which is a source of Si being an n-type dopant are used as an evaporation source.

After step (h), by using the MBE method, the buffer layer 150 composed of $n^+$-type GaAs is deposited on the $n^+$-type AlAs layer 41, and, after that, the n-type AlGaAs layer 1101 and n-type AlAs layer 1102 are laminated alternately by 10 cycles. Thus, the buffer layer 150 and the n-type distributed reflection film 110 are formed on the $n^+$-type AlAs layer 41 sequentially (refer to step (i)).

In this case, gallium (Ga) metal is used as a source of Ga.

Successively, i-type AlAs, i-type GaAs and i-type AlAs are laminated there sequentially by using the MBE method, and the active layer 120 is formed on the n-type distributed Bragg reflection film 110 (refer to step (j)).

After that, the p-type AlGaAs layer 1301 and the p-type AlAs layer 1302 are laminated alternately by 10 cycles by using the MBE method, and the p-type distributed reflection film 130 is formed on the active layer 120 (refer to step (k)).

Successively, a resist is coated over the surface of the p-type distributed reflection film 130, and the coated resist is patterned by using the photolithography technology. As a result, a resist pattern 50 is formed on the surface of the p-type distributed reflection film 130. Then, Cr and Au 141 and 142 are evaporated thinly and sequentially by vacuum evaporation (refer to step (l)). In this case, Cr is used for enhancing the adherence between Au and the ground. The thickness of Cr is 3 nm, and the thickness of Au is approximately 10 nm.

After that, the resist pattern 50 is removed by using a resist stripper. Thus, the Cr/Au 141 on the resist pattern 50 is removed by lift-off, and a part 142 of the window electrode 140 is formed (refer to step (m)).

Successively, through the same process, a resist pattern 60 is formed, and the resist pattern 60 is used as a mask to evaporate Au by vacuum evaporation (refer to step (n)). Then, the resist pattern 60 is removed by using a resist stripper. As a result, the Au 143 on the resist pattern 60 is removed by lift-off. Thus, the window electrode 140 is formed (refer to step (p)).

After that, a resist is coated all over the surface, and the coated resist is patterned by using the photolithography technology, whereby a resist pattern 70 is formed. Then, the resist pattern 70 is used as a mask to etch a part of the p-type distributed reflection film 130, the active layer 120, the n-type distributed reflection film 110, the buffer layer 150, $n^+$-AlAs layer 41 and n-type GaAs substrate 40 by the reactive ion etching, and the resist pattern 70 is removed (refer to step (q)).

After that, electron wax 42 dissolved to toluene is coated over the window electrode 140, and a glass substrate 43 is pasted thereto (refer to step (r)). Next, only the $n^+$-AlAs layer 41 is removed by etching with a hydrofluoric acid solution, and one resulting from the pasting of the light emitting device 113 to the glass substrate 43 is separated from the GaAs substrate 40 (refer to step (s)).

Successively, the light emitting device 113 pasted to the glass substrate 43 is aligned on and then pasted to a silicon substrate having the through electrodes 114. Thus, the input layer 1 is completed (refer to step (t)). The glass substrate 43 can be aligned by a similar method to that for a glass mask in general photolithography because it is optically transparent. It is known that the joint between metals such as Pd and GaAs, for example, with a Van der Waals force at a low temperature is possible for the pasting.

As described above, in the present invention the semiconductor light emitting device 113 is adhered to the semiconductor layer 12 composed of Si by pasting. Then, whether the semiconductor light emitting device 113 is adhered to the semiconductor layer 12 by pasting or not can be determined on the basis of whether any distortion is occurring in the crystal phases of the semiconductor light emitting device 113 or not.

In other words, as described above, after forming the semiconductor light emitting device 113 on the GaAs substrate, the semiconductor light emitting device 113 is pasted to the semiconductor layer 12 composed of Si. Therefore, no distortions occur in the crystal phases of the semiconductor light emitting device 113. On the other hand, in a case where a crystal layer of GaAs or the like is grown on the semiconductor layer 12 composed of Si to produce a semiconductor light emitting device, a distortion occurs in the crystal phase.

Therefore, on the basis of whether any distortion occurs in the crystal phases of the semiconductor light emitting device 113 or not, whether the semiconductor light emitting device 113 is adhered to the semiconductor layer 12 by pasting or not can be determined.

Then, because the semiconductor light emitting device 113 is adhered to the semiconductor layer 12 by pasting, the semiconductor light emitting device 113 can be produced by using a different material from the material of the semiconductor layer 12.

As a result of the production of the semiconductor light emitting device 113 by using a different material from the material of the semiconductor layer 12, the active layer 120 can be configured by the single well structure of GaAs, and the semiconductor light emitting device 113 that emits the light having the emission angle distribution in accordance with the electric field strength applied to the active layer 120 can be produced.

It is noted that the middle layer 2 and the output layer 3 can be produced by using the aforementioned the step (a) to the step (t).

Figure 16:
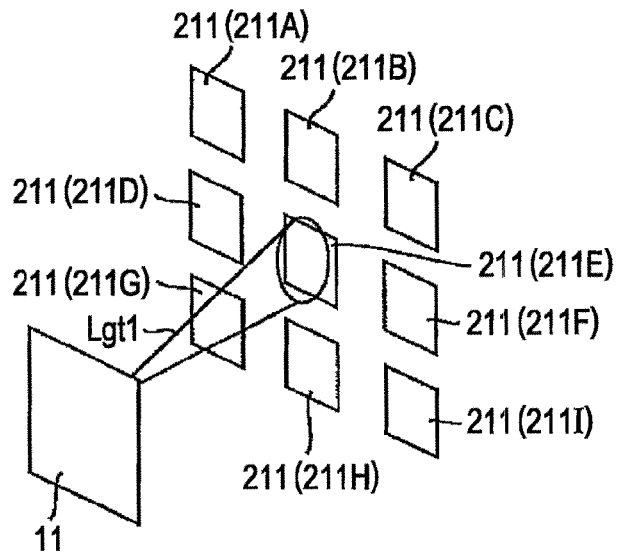
FIG. 16 is a first diagram for explaining the transmission of a signal from the input layer to the middle layer.
Figure 17:
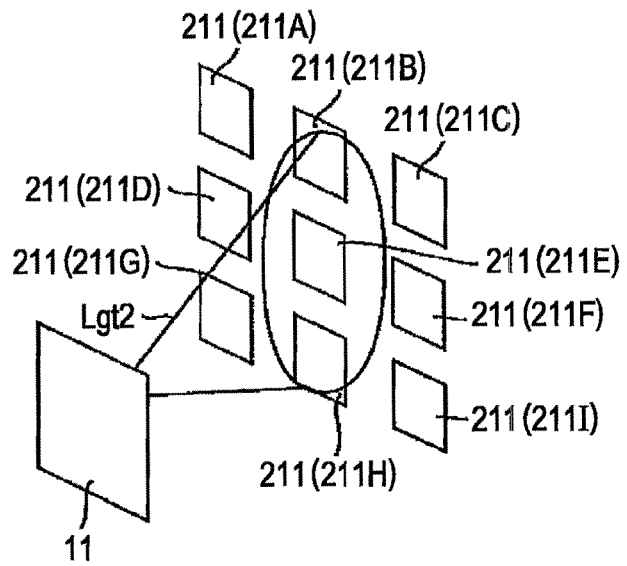
FIG. 17 is a second diagram for explaining the transmission of a signal from the input layer to the middle layer.

FIG. 16 is a first diagram for explaining the transmission of a signal from the input layer 1 to the middle layer 2. FIG. 17 is a second diagram for explaining the transmission of a signal from the input layer 1 to the middle layer 2.

Referring to FIG. 16, if the photodetector 111 in the input unit 11 receives an input signal composed of an optical signal with relatively strong light intensity, the photodetector 111 outputs a relatively high voltage Vd. Then, if the drive circuit 112 in the input unit 11 receives the relatively high voltage Vd, the drive circuit 112 detects a relatively low driving voltage Vdr with reference to the curve k1 and outputs the detected driving voltage Vdr to the semiconductor light emitting device 113. As a result, the semiconductor light emitting device 113 in the input unit 11 emits emission light Lgt1 with relatively narrow emission angle distribution.

Accordingly, only the photodetector 211(211E) included in one middle unit 21 of the middle layer 2 detects the emission light Lgt1 from the input unit 11, and the other photodetectors 211(211A) to 211(211D) and 211(211F) to 211(211I) do not detect the emission light Lgt1.

Because the emission light Lgt1 has a relatively narrow emission angle distribution, the photodetector 211(211E) detects light with a relatively strong light intensity per unit area.

Referring to FIG. 17, if the photodetector 111 in the input unit 11 receives an input signal composed of an optical signal with a relatively weak light intensity, the photodetector 111 outputs a relatively low voltage Vd. Then, if the drive circuit 112 in the input unit 11 receives the relatively low voltage Vd, the drive circuit 112 detects a relatively high driving voltage Vdr with reference to the curve k1 and outputs the detected driving voltage Vdr to the semiconductor light emitting device 113. As a result, the semiconductor light emitting device 113 in the input unit 11 emits the emission light Lgt2 with a relatively broad emission angle distribution.

Accordingly, the photodetector 211(211B), 211(211E) and 211(211H) in three middle units 21 of the middle layer 2 detects the emission light Lgt2 from the input unit 11, and the other photodetectors 211(211A), 211(211C), 211(211D), 211(211F), 211(211G) and 211(211I) do not detect the emission light Lgt2.

Because the emission light Lgt2 has a relatively broad emission angle distribution, the photodetectors 211(211B), 211(211E) and 211(211H) detect light with a relatively weak light intensity per unit area.

As described above, if the emission angle distribution is relatively narrow, only one middle unit 21 in the middle layer 2 receives the emission light Lgt1 from the input unit 11. In other words, only one middle unit 21 in the middle layer 2 receives a signal from the input unit 11. Therefore, if the emission angle distribution is a relatively narrow, the connection between one input unit 11 and one middle unit 21 becomes relatively strong, and the connection weight between one input unit 11 and one middle unit 21 becomes relatively large.

On the other hand, if the emission angle distribution is a relatively broad, three middle units 21 in the middle layer 2 receives the emission light Lgt2 from the input unit 11. In other words, three middle units 21 in the middle layer 2 receive a signal from the input unit 11. Therefore, if the emission angle distribution is a relatively broad, the connection between one input unit 11 and one middle unit 21 becomes relatively weak, and the connection weight between one input unit 11 and one middle unit 21 is relatively smaller.

As a result, the emission angle distribution expresses the connection weight between the input units 11 and the middle units 21. Then, because the emission angle distribution varies in accordance with the voltage level of the voltage Vd output by the photodetector 111 as described above, the light having the emission angle distribution may be used to connect the input unit 11 and the middle unit 21, whereby connection weight between the input units 11 and the middle units 21 can be changed flexibly in accordance with the voltage Vd output by the photodetector 111.

The middle unit 21 in the middle layer 2 and the output unit 31 in the output layer 3 are connected by the light having the emission angle distribution that varies in accordance with the voltage level of the voltage Vd output by the photodetector 211 included in the middle unit 21, and therefore the connection weight between the middle units 21 and the output units 31 can be changed flexibly in accordance with the voltage Vd output by the photodetector 211.

Figure 18:
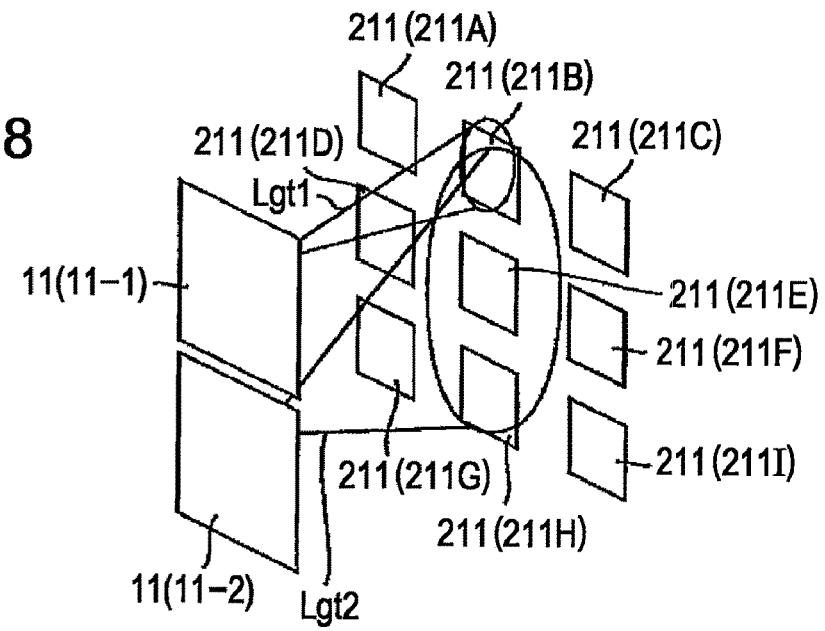
FIG. 18 is a third diagram for explaining the transmission of a signal from the input layer to the middle layer.

FIG. 18 is a third diagram for explaining the transmission of a signal from the input layer 1 to the middle layer 2. Referring to FIG. 18, if the input unit 11(11-1) in the input layer 1 emits the light Lgt1 and the input unit 11(11-2) emits the light Lgt2, the photodetector 211(211B) included in one middle unit 21 of the middle layer 2 receives the emission light Lgt1 from the input unit 11(11-1) and the emission light Lgt2 from the input unit 11(11-2).

The photodetectors 211(211E) and 211(211H) included in one middle unit 21 of the middle layer 2 receive the emission light Lgt2 from the input unit 11(11-2).

As a result, the middle unit 21 including the photodetector 211(211B) connects with the two input units 11(11-1) and 11(11-2) in the input layer 1, and the middle unit 21 including the photodetector 211(211E) and the middle unit 21 including the photodetector 211(211H) connects with one input unit 11(11-2) in the input layer 1.

More specifically, the middle unit 21 including the photodetector 211(211B) connects with the input unit 11(11-1) with a connection weight w1 and connects with the input unit 11(11-2) with a connection weight w2 (<w1). The middle unit 21 including the photodetector 211(211E) connects with the input unit 11(11-2) with a connection weight w3 (w2<w3<w1), and the middle unit 21 including the photodetector 211(211H) connects with the input unit 11(11-2) with a connection weight w4 (w2<w4<w3).

The broader the emission angle distribution of the light emitted from the input unit 11 becomes, the more the number of middle units 21 in the middle layer 2 that can receive the light from the input unit 11 becomes.

Therefore, by transmitting a signal from the input layer 1 to the middle layer 2 by light using the emission angle distribution as a connection weight, each of the middle units 21 in the middle layer 2 connects with one or more input units 11 in the input layer 1 with the corresponding connection weight. By transmitting a signal from the middle layer 2 to the output layer 3 by light using the emission angle distribution as a connection weight, each of the output units 31 in the output layer 3 connects with one or more middle units 21 in the middle layer 2 with the corresponding connection weight.

Figure 19:
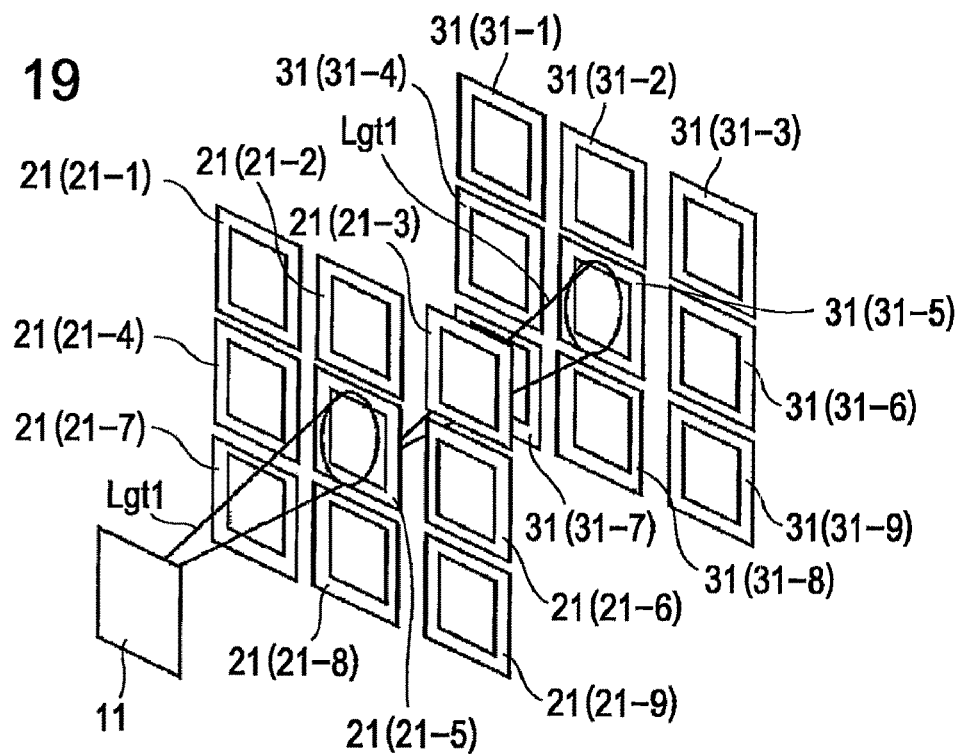
FIG. 19 is a first diagram for explaining the transmission of a signal from the input layer up to the output layer.
Figure 20:
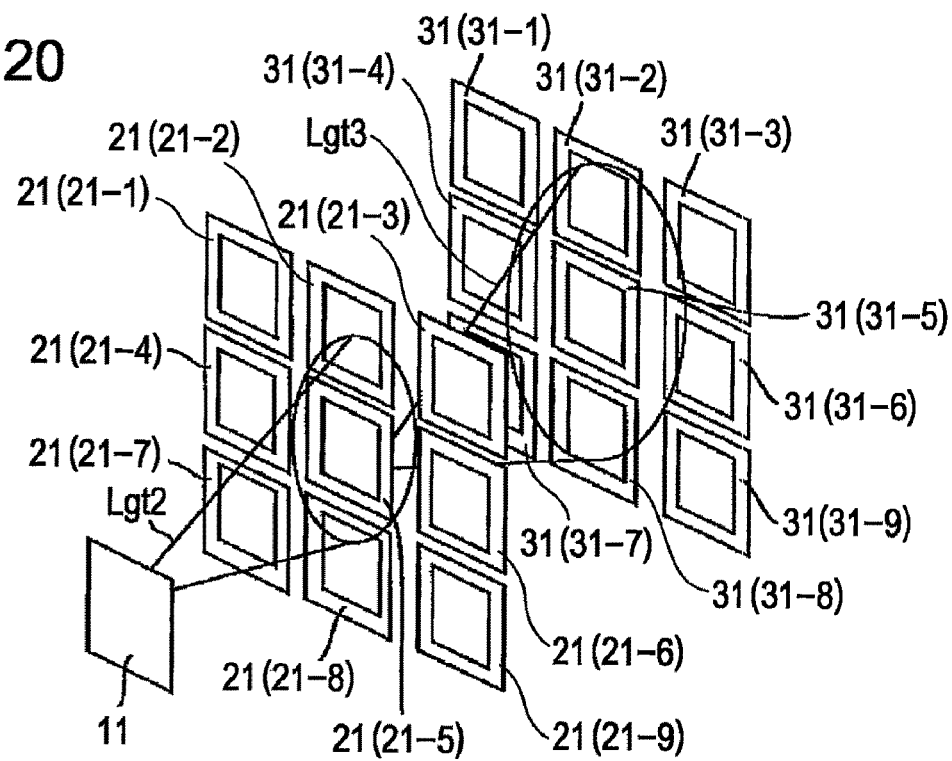
FIG. 20 is a second diagram for explaining the transmission of a signal from the input layer up to the output layer.

FIG. 19 is a first diagram for explaining the transmission of a signal from the input layer 1 up to the output layer 3. FIG. 20 is a second diagram for explaining the transmission of a signal from the input layer 1 up to the output layer 3.

Referring to FIG. 19, if the input unit 11 in the input layer 1 receives an input signal composed of a relatively strong optical signal, the input unit 11 emits light Lgt1 having a relatively narrow emission angle distribution to the middle layer 2 on the basis of the received input signal.

The middle unit 21(21-5) in the middle layer 2 receives the light Lgt1 from the input unit 11, and emits light Lgt1 having a relatively narrow emission angle distribution to the output layer 3 on the basis of the received light Lgt1 by the aforementioned method.

Accordingly, the output unit 31(31-5) in the output layer 3 receives the light Lgt1 from the middle unit 21(21-5).

As a result, if the input unit 11 emits light Lgt1 having a relatively narrow emission angle distribution to the middle layer 2, the middle unit 21(21-5) emits the light Lgt1 having a relatively narrow emission angle distribution to the output layer 3 on the basis of the light Lgt1 from the input unit 11. The output unit 31(31-5) in the output layer 3 receives the light Lgt1 having a relatively narrow emission angle distribution.

Therefore, if the photodetector 111 in the input unit 11 detects a relatively strong optical signal, the input signal is transmitted from the input layer 1 to the output layer 3 by the light Lgt1 having a relatively narrow emission angle distribution. In other words, if the input unit 11 emits the light Lgt1 having a relatively narrow emission angle distribution, the input signal is transmitted from the input layer 1 to the middle layer 2 and the output layer 3 sequentially by the light Lgt1 having a relatively narrow emission angle distribution. Then, if the middle unit 21(21-5) receives light from the plurality of input units 11, the input signal is transmitted from the input layer 1 to the middle layer 2 and the output layer 3 sequentially by light having a gradually decreasing emission angle distribution.

Referring to FIG. 20, if the input unit 11 in the input layer 1 receives an input signal composed of a relatively weak optical signal, the input unit 11 emits light Lgt2 having a relatively broad emission angle distribution to the middle layer 2 on the basis of the received input signal.

Then, the middle unit 21(21-5) in the middle layer 2 receives the light Lgt2 from the input unit 11 and emits the light Lgt3 having a broader emission angle distribution than that of the light Lgt2 to the output layer 3 on the basis of the received light Lgt2 by the aforementioned method.

Accordingly, the output unit 31(31-5) in the output layer 3 receives the light Lgt3 from the middle unit 21(21-5).

As a result, if the input unit 11 emits the light Lgt2 having a relatively broad emission angle distribution to the middle layer 2, the middle unit 21(21-5) emits the light Lgt3 having a broader emission angle distribution than that of the light Lgt2 to the output layer 3 on the basis of the light Lgt2 from the input unit 11, and the output unit 31(31-5) in the output layer 3 receives the light Lgt3 having a broader emission angle distribution than that of the light Lgt2.

Therefore, if the photodetector 111 in the input unit 11 detects a relatively weak optical signal, the input signal is transmitted from the input layer 1 to the output layer 3 by the light Lgt2 and Lgt3 having gradually increasing emission angle distributions. In other words, if the input unit 11 emits the light Lgt2 having a relatively broad emission angle distribution, the input signal is transmitted from the input layer 1 to the middle layer 2 and the output layer 3 sequentially by the light Lgt2 and Lgt3 having gradually increasing emission angle distributions.

Figure 21:
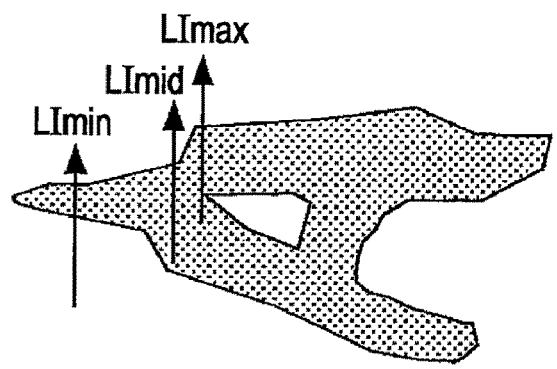
FIG. 21 is a diagram for explaining an input signal.
Figure 22:
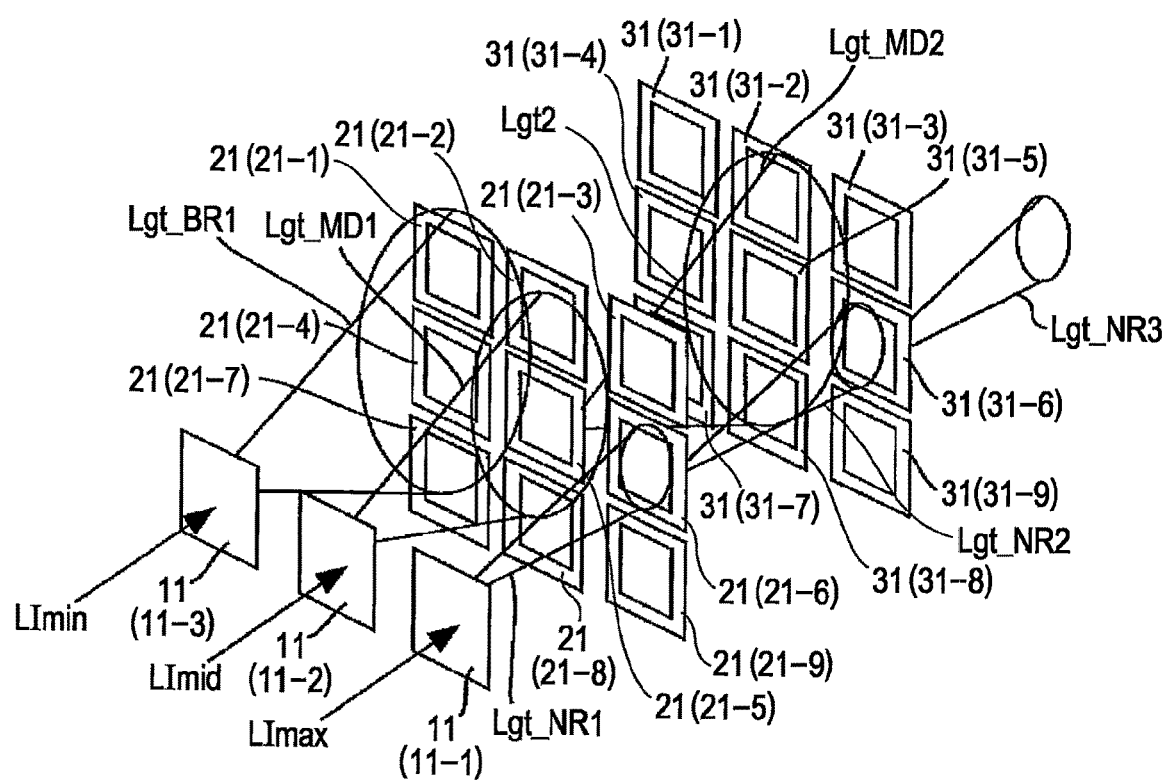
FIG. 22 is a diagram for explaining the transmission of the input signal shown in FIG. 21 from the input layer to the output layer.

FIG. 21 is a diagram for explaining an input signal. FIG. 22 is a diagram for explaining the transmission of the input signal shown in FIG. 21 from the input layer 1 to the output layer 3.

Referring to FIG. 21, the input signal of the letter "A" representing the letter "A" shown in FIG. 1 is composed of the strongest optical signal LImax, input signal of the part excluding the letter "A" is composed of the weakest optical signal LImin, the input signal of the part close to the boundary between the letter "A" part and the part excluding the letter is composed of an optical signal LImid having a medium strength.

Then, the input unit 11(11-1) receiving the optical signal LImax emits light Lgt_NR1 having the narrowest emission angle distribution. The input unit 11(11-2) receiving the optical signal LImid emits the light Lgt_MD1 having a middle emission angle distribution. The input unit 11(11-3) receiving the optical signal LImin emits light Lgt_BR1 having the broadest emission angle distribution.

The light Lgt_NR1 is received by the smallest number (one) of the middle unit 21(21-6), and the light Lgt_MD1 is received by a relatively many middle units 21(21-2), 21(21-5) and 21(21-8). The light Lgt_BR1 is received by the largest number of middle units 21(21-1), 21(21-2), 21(21-4), 21(21-5) and 21(21-7).

Therefore, the middle unit 21(21-6) receiving light Lgt_NR1 emits the light Lgt_NR2 having the emission angle distribution equal to or narrower than emission angle distribution of light Lgt_NR1. The middle units 21(21-2), 21(21-5) and 21(21-8) receiving the light Lgt_MD1 emits the light Lgt_MD2 having the emission angle distribution broader than the emission angle distribution of light Lgt_MD1. The middle units 21(21-1), 21(21-2), 21(21-4), 21(21-5) and 21(21-7) receiving the light Lgt_BR1 do not emit light because the intensity of the received light is lower than a threshold value.

Accordingly, the output unit 31(31-6) in the output layer 3 receives the light Lgt_NR2, and the output units 31(31-2), 31(31-4), 31(31-5) and 31(31-8) receive the light Lgt_MD2.

Then, the output unit 31(31-6) emits the light Lgt_NR3 having the emission angle distribution equal to or narrower than the emission angle distribution of the light Lgt_NR2. The output units 31(31-2), 31(31-4), 31(31-5) and 31(31-8) do not emit light since the intensity of the received light is lower than the threshold value.

As a result, the input signal composed of the optical signal LImax is output from the output layer 3 as the light Lgt_NR3, and the input signals composed of the optical signals LImid and LImin are not output from the output layer 3 as light.

Therefore, the letter "A" part is output brightly, and the part excluding the letter "A" and the boundary part between the letter "A" part and the part excluding the letter is output darkly. As a result, as shown in FIG. 1, a sharp letter "A" is output.

As well, in a case where the input signal of the letter "A" part is represented by the optical signal LImin, the input signal of the part excluding the letter "A" is represented by the optical signal LImax, and the input signal of the boundary party between the letter "A" part and the part excluding the letter is represented by the optical signal LImid, a sharp letter "A" can also be output by the aforementioned mechanism.

As described above, because the optical neural network 10 according to the present invention uses the emission angle distribution of light as the connection weight to transmit the input signal from the input layer 1 to the middle layer 2 and the output layer 3 sequentially, a blurred input image can be output as a sharp image.

Then, increasing the number of the middle layers allows the output of a much sharper image because light having a smaller received light intensity than the threshold value is not transmitted to the next layer (middle layer or output layer).

Figure 23:
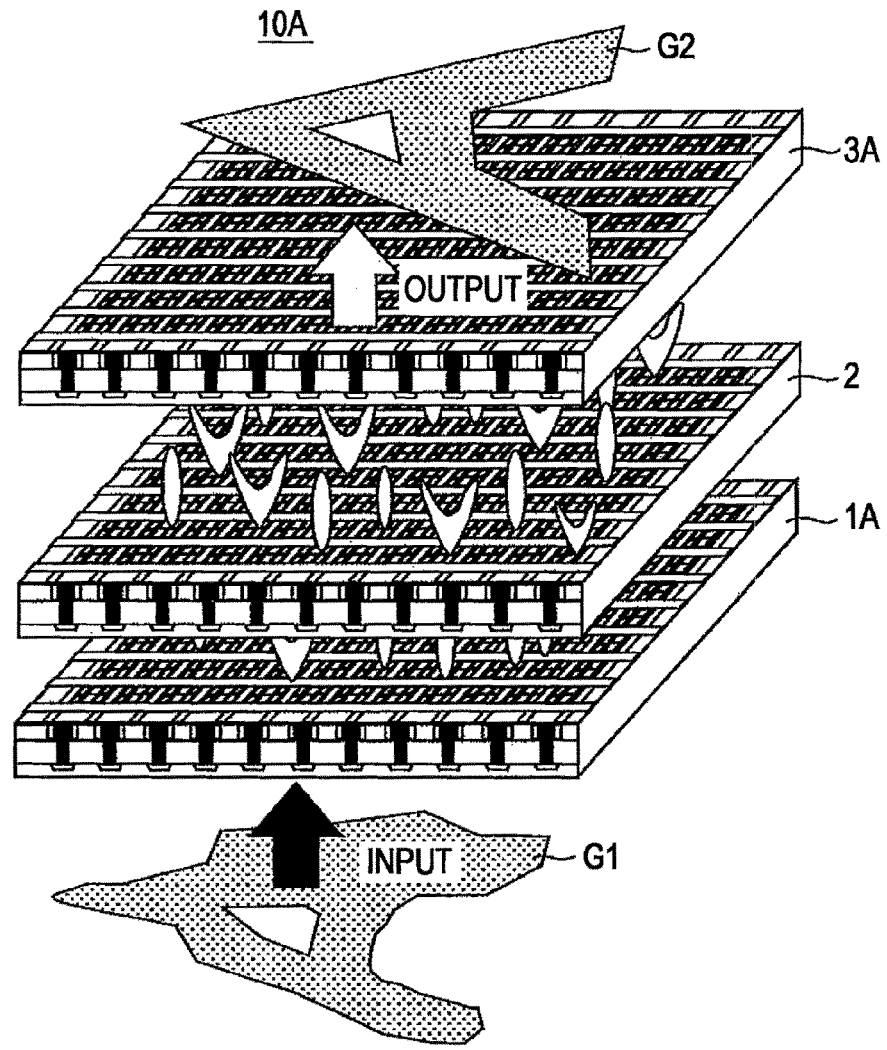
FIG. 23 is a configuration diagram of another optical neural network according to an embodiment of the present invention.

FIG. 23 is a configuration diagram of another optical neural network according to the embodiment of the present invention. The optical neural network according to the embodiment of the present invention may be an optical neural network 10A shown in FIG. 23.

Referring to FIG. 23, the optical neural network 10A includes an input layer 1A instead of the input layer 1 of the optical neural network 10 shown in FIG. 1 and an output layer 3A instead of the output layer 3, and the other configuration of the neural network 10 is the same as that of the optical neural network 10.

The input layer 1A receives an input signal composed of an analog value and outputs the received input signal as light to the middle layer 2. The output layer 3A receives light from the middle layer 2 and outputs an output signal composed of a digital value in accordance with the light intensity of the received light.

The planar structure of the input layer 1A viewed from the middle layer 2 side is the same as the planar structure of the input layer 1 shown in FIG. 2, and the planar structure of rear surface of the input layer 1A is the same as the planar structure of the input layer 1 shown in FIG. 3. The planar structure of the output layer 3A viewed from the output side is the same as the planar structure of the input layer 1 shown in FIG. 2, and the planar structure of the output layer 3A viewed from the middle layer 2 side is the same as the planar structure of the input layer 1 shown in FIG. 3.

Figure 24:
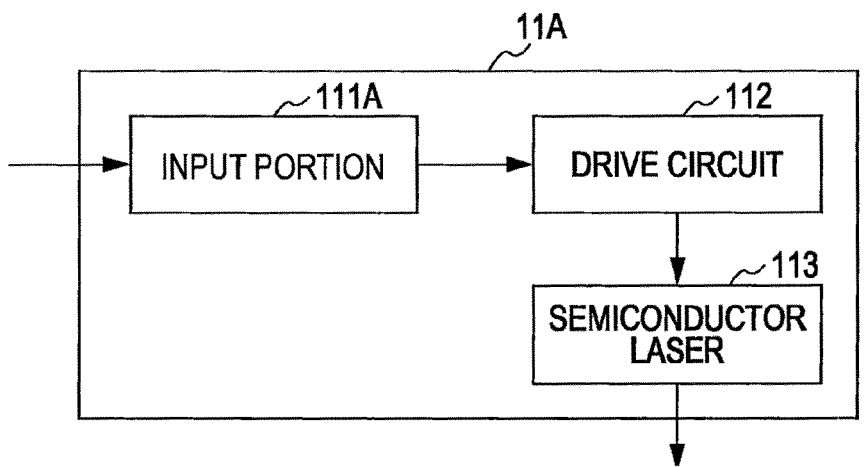
FIG. 24 is a configuration diagram of an input unit constituting the input layer shown in FIG. 23.

FIG. 24 is a configuration diagram of an input unit 11A composing the input layer 1A shown in FIG. 23. Referring to FIG. 24, the input unit 11A includes an input portion 111A instead of the photodetector 111 in the input unit 11 shown in FIG. 4, and the other configuration of the input unit 11A is the same as that of the input unit 11.

The input portion 111A receives the input signal composed of the analog value, converts the received analog value to voltage Vd and outputs it to the drive circuit 112. More specifically, if the input portion 111A receives the input signal of the letter "A" part, the input portion 111A converts the received input signal to voltage Vd1 (a kind of voltage Vd) and outputs it to the drive circuit 112. If the input portion 111A receives the input signal of the boundary part between the letter "A" part and the part excluding the letter, the input portion 111A converts the received input signal to voltage Vd2 (<Vd1) and outputs it to the drive circuit 112. If the input portion 111A receives the input signal of the part excluding the letter "A", the input portion 111A converts the received input signal to voltage Vd3 (<Vd2) and outputs it to the drive circuit 112.

Figure 25:
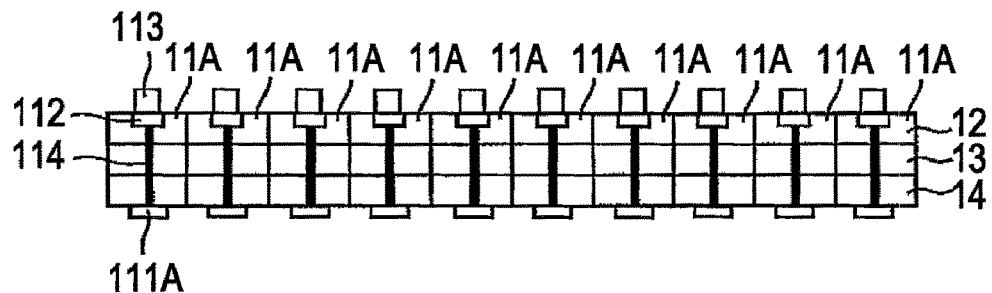
FIG. 25 is a sectional view of the input layer shown in FIG. 23.

FIG. 25 is a sectional view of the input layer 1A shown in FIG. 23. Referring to FIG. 25, the input portion 111A in each of the input units 11A is arranged on the surface of the semiconductor layer 14 and is connected to the drive circuit 112 by the through-wires 114.

The input layer 1A is produced by following step (a) to step (t) shown in FIG. 10 to FIG. 15. In the step (g) shown in FIG. 10, the input portion 111A instead of the photodetector 111 is formed on the surface of the semiconductor layer 14.

Figure 26:
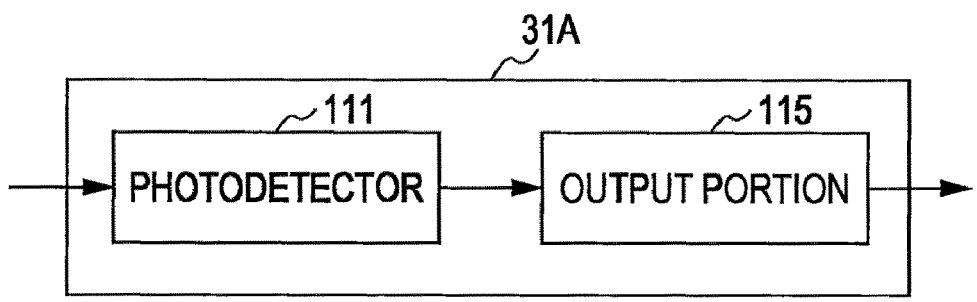
FIG. 26 is a configuration diagram of an output unit included in the output layer shown in FIG. 23.

FIG. 26 is a configuration diagram of the output unit 31A included in the output layer 3A shown in FIG. 23. Referring to FIG. 26, the output unit 31A includes the photodetector 111 and an output portion 115. The output portion 115 receives the voltage Vd from the photodetector 111, converts the received voltage Vd to an output signal composed of a digital value, and outputs the output signal. More specifically, if the output portion 115 receives the voltage Vd from the photodetector 111, the output portion 115 converts the voltage Vd to "1" if the received voltage Vd is equal to or higher than the threshold value or converts the voltage Vd to "0" if the voltage Vd is smaller than the threshold value, and output portion 115 outputs "1" or "0".

Figure 27:
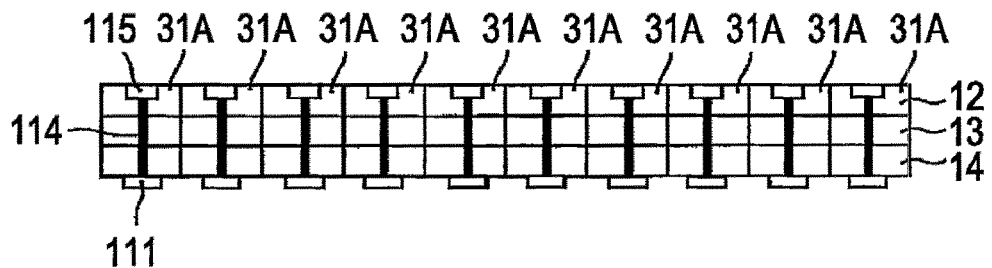
FIG. 27 is a sectional view of the output layer shown in FIG. 23.

FIG. 27 is a sectional view of the output layer 3A shown in FIG. 23. Referring to FIG. 27, the output portion 115 of each of the output units 31A is formed on one principal surface of the semiconductor layer 12 and is connected to the photodetector 111 by the through-wires 114.

The output layer 3A is produced by following the step (a) to the step (g) shown in FIG. 10. In the step (b) shown in FIG. 10, the output portion 115 instead of the drive circuit 112 is formed on one principal surface of the semiconductor layer 12.

In the optical neural network 10A, the input portion 111A in each of the input units 11A of the input layer 1A receives the input signal composed of an analog value and converts the analog value to voltage Vd in accordance with the magnitude of the received analog value and outputs it to the drive circuit 112. By the aforementioned method, the drive circuit 112 converts the voltage Vd to the driving voltage Vdr and outputs it to the semiconductor light emitting device 113. The semiconductor light emitting device 113 emits light having the emission angle distribution in accordance with the voltage level of the driving voltage Vdr to the middle layer 2.

Then, the photodetector 111 in each of the middle units 21 of the middle layer 2 receives light from the input layer 1A, converts the light to the voltage Vd in accordance with the light intensity of the received light and outputs it to the drive circuit 112. By the aforementioned method, the drive circuit 112 converts the voltage Vd to the driving voltage Vdr, and outputs it to the semiconductor light emitting device 113. The semiconductor light emitting device 113 outputs the light having the emission angle distribution in accordance with the voltage level of the driving voltage Vdr to the output layer 3A.

Accordingly, the photodetector 111 in each of the output unit 31A of the output layer 3A receives the light from the middle layer 2, converts the light to voltage Vd in accordance with the light intensity of the received light and outputs it to the output portion 115. The output portion 115 converts the voltage Vd to a digital value and outputs a signal composed of the converted digital value.

As a result, the optical neural network 10A converts the input signal composed of blurred letter "A" shown in FIG. 1 to an output signal composed of sharp letter "A" by the same mechanism as that of the optical neural network 10, and outputs the output signal.

It is noted that the optical neural network 10A may include a plurality of middle layers 2.

In the optical neural network 10 or 10A, each of the input unit 11 (or 11A), the middle unit 21 and the output unit 31 (or 31A) corresponds to a synapse in a nervous system. Each of the input units 11 (or 11A) connects to one or more middle units 21 by using the light having an emission angle distribution representing the connection weight, and each of the middle units 21 connects to one or more output units 31 (or 31A) by using the light having an emission angle distribution representing the connection weight.

Therefore, in the optical neural network 10 or 10A, the wire connecting the input unit 11 (or 11A) to the middle unit 21 and the wire connecting the middle unit 21 to the output unit 31 (or 31A) are not required, and the light having an emission angle distribution may be used to connect an arbitrary input unit 11 (or 11A) to an arbitrary middle unit 21 and connect an arbitrary 21 to an arbitrary output unit 31 (or 31A).

As described above, the input layer 1, the middle layer 2 and the output layer 3 in the optical neural network 10 are composed of the semiconductor layers 12 and 14, and the input layer 1A, the middle layer 2 and the output layer 3A in the optical neural network 10A are composed of the semiconductor layers 12 and 14.

Therefore, according to the present invention, by using a semiconductor process, the optical neural network 10 or 10A can be manufactured.

In the optical neural network 10 or 10A, the input layer (1A) and the middle layer 2 are optically connected, and the middle layer 2 and the output layer 3 (3A) are optically connected.

Therefore, according to the present invention, the plurality of input units 11 (11A) in the input layer 1 (1A) and the plurality of middle units 21 in the middle layer 2 can be connected without complicated wiring, and the plurality of middle units 21 in the middle layer 2 and the plurality of output units 31 (31A) in the output layer 3 (3A) can be connected without complicated wiring.

As a result, this can prevent the occurrence of the connection error between the plurality of input units 11 (11A) in the input layer 1(1A) and the plurality of middle units 21 in the middle layer 2 and the connection error between the plurality of middle units 21 in the middle layer 2 and the plurality of output units 31 (31A) in the output layer 3 (3A), whereby the highly reliable optical neural network 10 or 10A can be manufactured.

Moreover, in the optical neural network 10 or 10A, because the emission angle distribution as the connection weight is determined in accordance with the voltage level of the voltage Vd, various kinds of input signals can be processed without resetting the connection weight.

Still further, as described above, the optical neural network 10 detects the input signal composed of the optical signal by the photodetector 111, performs the transmission of the detected input signal from the input layer 1 to the middle layer 2 and the transmission from the middle layer 2 to the output layer 3 by using the light having the emission angle distribution, and outputs the output signal composed of the optical signal.

Furthermore, the optical neural network 10A receives the input signal composed of the analog value by the input portion 111A, performs the transmission of the received input signal from the input layer 1 to the middle layer 2 and the transmission from the middle layer 2 to the output layer 3 by using the light having the emission angle distribution, and outputs the output signal composed of the digital value.

Therefore, the optical neural network according to the present invention may generally connect between the input layer and the middle layer and between the middle layer and the output layer by using the light having the emission angle distribution representing the connection weights.

Having described that the input signal contains image data representing letter "A", the input signal may contain data excluding image data in this embodiment, without limiting thereto.

Having described that the input layer 1 or 1A includes 100 input units 11 or 11A, the middle layer 2 includes 100 middle units 21, and the output layer 3 or 3A includes 100 output units 31 or 31A, the input layer 1 or 1A may be only required to include i (where i is a positive integer) input units 1 and 1A, the middle layer 2 may be only required to include j (where j is a positive integer) middle units 21, and the output layer 3 or 3A is only required to include k (k positive integers) output units 3 or 3A, generally in this embodiment, without limiting thereto.

Having described that the voltage Vd and the driving voltage Vdr have a non-linear relationship, the voltage Vd and the driving voltage Vdr may have a linear relationship, in this embodiment, without limiting thereto.

Having described that the semiconductor light emitting device 113 is pasted to the semiconductor layer 12, the semiconductor light emitting device 113 may be epitaxially grown on the semiconductor layer 12 in the present invention, without limiting thereto.

In this embodiment, each of the input layers 1 and 1A constitutes the "input semiconductor layer", the middle layer 2 constitutes the "middle semiconductor layer", and each of the output layers 3 and 3A constitutes the "output semiconductor layer".

In this embodiment, the semiconductor layers 12 and 14 and the insulating film 13 composing the input layer 1 or 1A constitute the "first semiconductor substrate".

In this embodiment, the semiconductor layers 12 and 14 and the insulating film 13 composing the middle layer 2 constitute the "second semiconductor substrate".

In this embodiment, the semiconductor layers 12 and 14 and the insulating film 13 composing the output layer 3 constitute the "third semiconductor substrate".

In this embodiment, the photodetector 111 included in the input unit 11 and the input portion 111A included in the input unit 11A constitute the "detector".

In this embodiment, the photodetector 111 included in the middle unit 21 constitutes the "first photodetector", and the photodetector 111 included in the output unit 31 or 31A constitutes the "second photodetector".

In this embodiment, the semiconductor light emitting device 113 included in the output unit 31 and the output portion 115 included in the output unit 31A constitute the "output circuit".

In this embodiment, the drive circuit 112 included in the input unit 11 constitutes the "first drive circuit", and the semiconductor light emitting device 113 included in the input unit 11 constitutes the "first semiconductor light emitting device".

In this embodiment, the drive circuit 112 included in the middle unit 21 constitutes the "second drive circuit", and the semiconductor light emitting device 113 included in the middle unit 21 constitutes the "second semiconductor light emitting device".

In this embodiment, the through-wire 114 included in the input unit 11 constitutes the "first metal wire", and the through-wire 114 included in the middle unit 21 constitutes the "second metal wire".

In this embodiment, the semiconductor light emitting device 113 included in the output unit 31 constitutes the "third semiconductor light emitting device".

It should be considered that the embodiments have been disclosed for the illustration purpose only and are not limitative in all points. It is intended that the scope of the present invention is not represented by the description on the aforementioned embodiments but the claims and includes all changes within the equivalent spirit and scope to those of the claims.

INDUSTRIAL APPLICABILITY

The present invention is applicable to an optical neural network in which the connection weights can be changed flexibly.

The invention claimed is:

1. An optical neural network comprising:
an input semiconductor layer receiving an input signal and outputs a first output signal on the basis of the received input signal;
a middle semiconductor layer provided to face the input semiconductor layer, receiving the first output signal from the input semiconductor layer and outputting a second output signal on the basis of the received first output signal; and
an output semiconductor layer provided to face the middle semiconductor layer, receiving the second output signal from the middle semiconductor layer and outputting a final output signal on the basis of the received second output signal,
wherein:
the input semiconductor layer outputs light having a first emission angle distribution to the middle semiconductor layer as the first output signal if the signal level of the input signal is a first level and outputs light having a second emission angle distribution which is broader than the first emission angle distribution to the middle semiconductor layer as the first output signal if the signal level of the input signal is a second level which is lower than the first level; and
the middle semiconductor layer outputs light having a third emission angle distribution to the output semiconductor layer as the second output signal if the signal level of the first output signal is a third level and outputs light having a fourth emission angle distribution which is broader than the third emission angle distribution to the output semiconductor layer as the second output signal if the signal level of the first output signal is a fourth level which is lower than the third level.

2. The optical neural network according to claim 1, wherein:
the input semiconductor layer includes i (where i is a positive integer) input units;
the middle semiconductor layer includes j (where j is a positive integer) middle units; and
the output semiconductor layer includes k (where k is a positive integer) output units;
each of the i input units includes:
a first semiconductor substrate;
a detector provided on one principal surface of the first semiconductor substrate, detecting the signal level of the input signal and outputting output voltage reflecting the detected signal level; and
a first semiconductor light emitting device provided on the opposite surface to the one principal surface of the first semiconductor substrate where the detector is provided, emitting light having a relatively narrow emission angle distribution to the middle semiconductor layer when the voltage level of the input voltage from the detector is relatively high, and emitting light having a relatively broad emission angle distribution to the middle semiconductor layer when the voltage level of the input voltage from the detector is relatively low;
each of the j middle units includes:
a second semiconductor substrate provided to face the first semiconductor substrate;
a first photodetector provided on one principal surface on the first semiconductor substrate side of the second semiconductor substrate, receiving light emitted from the input unit included in the input semiconductor layer and outputting voltage reflecting the intensity of the received light; and
a second semiconductor light emitting device provided on the opposite surface to the one principal surface of the second semiconductor substrate where the first photodetector is provided, emitting light having a relatively narrow emission angle distribution to the output semiconductor layer when the voltage level of voltage output from the first photodetector is relatively high, and emitting light having a relatively broad emission angle distribution to the output semiconductor layer when the voltage level of voltage output from the first photodetector is relatively low; and
each of the k output units includes:
a third semiconductor substrate provided to face the second semiconductor substrate;
a second photodetector provided on one principal surface on the second semiconductor substrate side of the third semiconductor substrate, receiving light emitted from the middle unit included in the middle semiconductor layer and outputting the voltage reflecting the intensity of the received light; and
an output circuit converting the voltage output from the second photodetector to an element signal constituting the final output signal and outputs the converted element signal.

3. The optical neural network according to claim 2, wherein:
each of the i input units further includes:
a first drive circuit provided on the opposite surface to the one principal surface of the first semiconductor substrate where the detector is provided, converting the input voltage output from the detector to first driving voltage in accordance with the voltage level and outputting the converted first driving voltage to the first semiconductor light emitting device;
each of the j middle units further includes:
a second drive circuit provided on the opposite surface to the one principal surface of the second semiconductor substrate where the first photodetector is provided, converting the voltage output from the first photodetector to second driving voltage in accordance with the voltage level and outputting the converted second driving voltage to the second semiconductor light emitting device;
the first semiconductor light emitting device emits light having the emission angle distribution in accordance with the voltage level of the first driving voltage to the middle semiconductor layer; and
the second semiconductor light emitting device emits light having the emission angle distribution in accordance with the voltage level of the second driving voltage to the output semiconductor layer.

4. The optical neural network according to claim 3, wherein:
each of the i input units further includes a first metal wire penetrating the first semiconductor substrate in the thickness direction and connecting the detector to the first drive circuit; and
each of the j middle units further includes a second metal wire penetrating the second semiconductor substrate in the thickness direction and connecting the first photodetector to the second drive circuit.

5. The optical neural network according to claim 3, wherein:
the input signal is composed of an optical signal; and
the detector receives the optical signal, converts the received optical signal to the input voltage reflecting the strength of the optical signal and outputs it to the first drive circuit.

6. The optical neural network according to claim 2, wherein:
- the first semiconductor light emitting device is fixed to the first semiconductor substrate by pasting; and
- the second semiconductor light emitting device is fixed to the second semiconductor substrate by pasting.

7. The optical neural network according to claim 6, wherein:
- the first semiconductor light emitting device contains a different material from the material of the first semiconductor substrate; and
- the second semiconductor light emitting device contains a different material from the material of the second semiconductor substrate.

8. The optical neural network according to claim 2, wherein:
- the first semiconductor light emitting device is formed on the first semiconductor substrate by heteroepitaxy; and
- the second semiconductor light emitting device is formed on the second semiconductor substrate by heteroepitaxy.

9. The optical neural network according to claim 8, wherein:
- the first semiconductor light emitting device contains a different material from the material of the first semiconductor substrate; and
- the second semiconductor light emitting device contains a different material from the material of the second semiconductor substrate.

10. The optical neural network according to claim 2, wherein the output circuit converts voltage output from the second photodetector to a digital value and outputs the converted digital value as the element signal.

11. The optical neural network according to claim 2, wherein the output circuit includes a third semiconductor light emitting device provided on the opposite surface to the one principal surface of the third semiconductor substrate where the second photodetector is provided, emitting light having a relatively narrow emission angle distribution as the element signal when the voltage level of the voltage output from the second photodetector is relatively high, and emitting light having a relatively broad emission angle distribution as the element signal when the voltage level of the voltage output from the second photodetector is relatively low.

12. The optical neural network according to claim 11, wherein:
- the output circuit further includes a drive circuit generating a relatively low third drive voltage when the voltage level of voltage output from the second photodetector is relatively high, generating a relatively high third driving voltage when the voltage level of voltage output from the second photodetector is relatively low, and outputs the generated third driving voltage to the third semiconductor light emitting device; and
- the third semiconductor light emitting device outputs light having the emission angle distribution in accordance with the voltage level of the third driving voltage as the element signal.

13. The optical neural network according to claim 12, wherein the third semiconductor light emitting device is fixed to the third semiconductor substrate by pasting.

14. The optical neural network according to claim 12, wherein the third semiconductor light emitting device is formed on the third semiconductor substrate by heteroepitaxy.

* * * * *